(12) United States Patent
Yoshimaru et al.

(10) Patent No.: US 8,077,456 B2
(45) Date of Patent: Dec. 13, 2011

(54) APPARATUS, MOUNTING STRUCTURE, AND MOUNTING METHOD

(75) Inventors: Masaki Yoshimaru, Kawasaki (JP); Naohiko Kajio, Kawasaki (JP); Takashi Imamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/759,782

(22) Filed: Apr. 14, 2010

(65) Prior Publication Data

US 2010/0195283 A1 Aug. 5, 2010

Related U.S. Application Data

(63) Continuation of application No. PCT/JP2007/070383, filed on Oct. 18, 2007.

(51) Int. Cl.
*G06F 1/20* (2006.01)
*H05K 7/20* (2006.01)

(52) U.S. Cl. ......... 361/679.48; 361/679.49; 361/679.5; 361/694; 361/695; 361/716; 361/721; 211/41.17; 312/223.2; 312/236; 454/184

(58) Field of Classification Search .. 361/679.48–679.5, 361/694–695, 716, 721, 741, 756, 796, 727; 454/184; 211/41.17; 312/223.2, 236
See application file for complete search history.

(56) References Cited

U.S. PATENT DOCUMENTS

| 3,364,395 | A | * | 1/1968 | Donofrio et al. | ......... | 361/679.54 |
|---|---|---|---|---|---|---|
| 4,483,178 | A | * | 11/1984 | Miille | ............ | 73/708 |
| 5,140,501 | A | * | 8/1992 | Takahashi et al. | ............ | 361/798 |
| 5,410,448 | A | * | 4/1995 | Barker et al. | ............ | 361/695 |
| 5,467,254 | A | * | 11/1995 | Brusati et al. | ............ | 361/799 |
| 7,006,358 | B2 | * | 2/2006 | Liu et al. | ............ | 361/752 |
| 7,656,669 | B2 | * | 2/2010 | Lee et al. | ............ | 361/732 |

FOREIGN PATENT DOCUMENTS

| JP | 57-7998 | 1/1982 |
|---|---|---|
| JP | 03-21889 | 3/1991 |
| JP | 09-8480 | 1/1997 |
| JP | 09-36577 | 2/1997 |

OTHER PUBLICATIONS

International Search Report for PCT/JP2007/070383, mailed on Dec. 18, 2007.
English Translation of the International Preliminary Report on Patentability issued May 11, 2010 in corresponding International Patent Application PCT/JP2007/070383.

* cited by examiner

*Primary Examiner* — Robert J Hoffberg
(74) *Attorney, Agent, or Firm* — Fujitsu Patent Center

(57) ABSTRACT

An apparatus has a plurality of printed board units each including a printed board, a frame to have the printed board arranged therein, a first rail to be arranged at a first lower end of an inner wall of the frame having the printed board located thereon in a lower opening of the frame, and a second rail to be arranged at a second lower end opposed to the first lower end in the opening; a housing including a rail holding unit to movably hold the first rail of a first printed board unit and the second rail of a second printed board unit adjacent to the first printed board unit among the plurality of printed board units; and a cooling fan to be arranged on an upper side or underside of the housing to send air into the frame.

8 Claims, 25 Drawing Sheets

APPARATUS, MOUNTING STRUCTURE, AND MOUNTING METHOD

CROSS-REFERENCE TO RELATED APPLICATIONS

This application is a continuation of International Application No. PCT/JP2007/070383, filed on Oct. 18, 2007, now pending, herein incorporated by reference.

FIELD

The embodiments discussed herein are related to apparatus, mounting structure, and mounting method.

BACKGROUND

Electronic devices such as server apparatuses employ a structure including a plurality of printed board units to enhance mounting efficiency of circuit devices and electronic components in a housing and to enhance cooling efficiency of apparatuses.

Concerning an apparatus structure including a printed board in a housing, Japanese Laid-Open Patent Publication No. 09-08480 discloses mounting a printed wiring board through guide rails on a housing and including warpage preventing unit that protects the printed wiring board against warpage and a fall preventing unit that prevents the board from falling (summary, FIG. 1, etc.). Japanese Laid-Open Patent Publication No. 57-07998 discloses linking a printed board and a heavy-part loading board with a distance and placing into a printed-board housing unit the printed board and the heavy-part loading board being supported with guiding grooves corresponding to the printed board and the heavy-part loading board (detailed description of the invention, FIG. 2, etc.).

It is desired that a printed board unit loaded with heavy parts are prevented from tilting or falling due to the displacement of the gravity center to achieve stable insertion into a housing. However, if rails are respectively provided on the left and right lower sides of the unit to prevent falling (Japanese Laid-Open Patent Publication No. 57-07998), two guide rails corresponding to the two rails are necessary and, although a fall preventing unit may be provided (Japanese Laid-Open Patent Publication No. 09-08480), such a structure increases the number of parts, resulting in cost increase.

Although flowing of cooling air is essential for cooling heat generating parts loaded in a printed board unit, the number of disposed rails increases in proportion to the number of loaded printed board units and, if a guide rail is disposed for each of the rails, an area occupied by the guide rails reduces an area for sucking the cooling air and causes the reduction of the cooling efficiency of an apparatus or the heat generating parts.

With regard to a server apparatus using such rails and guide rails, a server apparatus 2 depicted in FIG. 1 has four printed board units 61, 62, 63 and 64 disposed in a housing 4, respectively, and a cooling fan device 12 combining a plurality of fan units 10 is disposed on the upper side of the housing 4 for cooling heat generating parts 8, etc.

As depicted in FIG. 2, two guide rails 14 and 16 corresponding to each of the printed board units 61 to 64 are arranged on the inner bottom portion of the housing 4, respectively. As depicted in FIGS. 3 and 4, rails 20 and 22 to be supported by the guide rails 14 and 16 are attached to the bottom edges of a frame 18 of each of the printed board units 61 to 64.

When $L_1$ denotes a unit width of each of the printed board units 61 to 64 and $L_2$ denotes an inner distance between the guide rails 14 and 16, the inner distance $L_2$ is set smaller than the unit width $L_1$. Each of the printed board units 61 to 64 has a cavity form with the bottom side thereof and the top side opened to ambient air and, when the cooling fan device 12 is activated, cooling air 24 (FIG. 5) passes through the printed board units 61 to 64 from the bottom side and flows into the cooling fan device 12. In this case, an area for sucking the cooling air 24 is formed in accordance with the inner distance $L_2$ of the guide rails 14 and 16 rather than the unit width $L_1$. That is, the flow rate of the cooling air 24 is reduced by a difference between the unit width $L_1$ and the inner distance $L_2$ ($L_1-L_2=\Delta L$).

In an enlarged view of the guide rails 14 and 16 and adjacent part thereto, as depicted in FIG. 5, a main flow passage 26 of the cooling air 24 flowing for cooling the heat generating part 8 is formed in each of the printed board units 61 and 62. When $L_3$ denotes a distance between the adjacent printed board units 61 and 62, this distance $L_3$ forms a leakage passage 28 of the cooling air 24 and the cooling air 24 flowing through the leakage passage 28 makes no contribution to the cooling of the heat generating part 8 and is wasted. When n denotes the number of disposed printed board units, the number of distances is (n−1) and a total distance Lm of the leakage passages 28 formed in the housing 4 is as follows:

$$Lm=(n-1)\times L_3 \quad (1)$$

In this case, since n=4, the total distance is $Lm=3\times L_3$.

When t denotes a thickness of a metal plate forming the guide rail 16, since the distance $L_3$ includes the thickness t of the guide rail 16 side, the distance for the leakage passage 28 is reduced to ($L_3-t$) in this case. However, the thickness t is small and does not lead to the reduction of the cooling air 24 flowing through the leakage passage 28.

The leakage passage 28 increases in proportion to the number of the disposed printed board units 61 to 64 in the housing 4 and, for example, in the case of the four printed board units 61 to 64 as depicted in FIG. 6, the number of the leakage passages 28 is three. The cooling air 24 flowing through these leakage passages 28 is exhausted to the outside through a duct 30 disposed on the upper side of the housing 4 along with the cooling air 24 flowing through the main flow passages 26.

As depicted in FIGS. 7 and 8, the adjacent guide rails 14 and 16 are disposed with a distance $L_4$ provided therebetween. The distance $L_4$ is set to a width allowing the above distance $L_3$ to be ensured. Guides 32 are made up within the distance $L_4$ by cutting and raising entries of the guide rails 14 and 16 to make protrusion in the width directions. Useless space exists between the adjacent printed board units 61 and 62, between the printed board units 62 and 63, and between the printed board units 63 and 64 as above and causes the disposition areas of the printed board units 61 to 64 and the volumes of the printed board units 61 to 64 to be narrowed.

Such problems are not suggested or disclosed and a means for solving the problems is not disclosed in Japanese Laid-Open Patent Publication No. 09-08480 and Japanese Laid-Open Patent Publication No. 57-07998.

SUMMARY

According to an aspect of the embodiments of the present invention, an apparatus has a plurality of printed board units each including a printed board to have heat generating parts arranged thereon, a frame to have the printed board arranged therein, a first rail to be arranged at a first lower end of an inner wall of the frame having the printed board located thereon in a lower opening of the frame, and a second rail to be arranged at a second lower end opposed to the first lower end in the opening; a housing including a rail holding unit to have a shape conforming or approximate to a square U-shape and to movably hold the first rail of a first printed board unit and the second rail of a second printed board unit adjacent to the first printed board unit among the plurality of printed board units; and a cooling fan to be arranged on an upper side or underside of the housing to send air into the frame.

According to another aspect of the embodiments of the present invention, in a mounting structure of mounting a plurality of printed board units to a housing, each of the plurality of printed board units includes a printed board to have heat generating parts arranged thereon, a frame to have the printed board arranged therein, a first rail to be arranged at a first lower end of an inner wall having the printed board located thereon in a lower opening of the frame, and a second rail to be arranged at a second lower end opposed to the first lower end in the opening, and the housing includes a cooling fan to be arranged on an upper side or underside of the housing to send air into the frame, and a rail holding unit to have a shape conforming or approximate to a square U-shape and to movably hold the first rail of a first printed board unit and the second rail of a second printed board unit adjacent to the first printed board unit among the plurality of printed board units.

According to further another aspect of the embodiments of the present invention, a mounting method of an apparatus to mount a plurality of printed board units to a housing includes arranging a printed board having heat generating parts arranged thereon within a frame of each of the plurality of printed board units; arranging first rails respectively at respective first lower ends of inner walls having the printed boards located thereon in lower openings included respectively in the frames of the plurality of printed board units; arranging second rails respectively at respective second lower ends opposed to the respective first lower ends in the openings; and inserting into a rail holding unit having a shape conforming or approximate to a square U-shape the first rail of a first printed board unit and the second rail of a second printed board unit adjacent to the first printed board unit among the plurality of printed board units in the housing arranged with a cooling fan sending air into the frame on an upper side or underside of the housing.

According to further another aspect of the embodiments of the present invention, an apparatus has a plurality of printed board units each including a printed board to have electric components arranged thereon, a frame to have the printed board arranged therein, the frame having an opening formed on an underside thereof, a first rail to be arranged at a first side of a lower end of the frame, and a second rail to be arranged at a second side of a lower end of the frame opposed to the first side; and a housing to include a rail holding unit that holds the first rail provided on a first printed board unit and the second rail provided on a second printed board unit loaded adjacently to the first printed board unit among the plurality of printed board units such that the printed board units are freely moved.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed Other objects, features and advantages of the present invention will become more apparent by reference to the accompanying drawings and embodiments.

DESCRIPTION OF EMBODIMENTS

Embodiments of the present invention are an apparatus including a plurality of printed board units in a housing and a common rail holding unit holds adjacent rails of the adjacent printed board units. This narrows a distance between the adjacent printed board units and reduces an area occupied by a rail holding unit in the housing through sharing of the rail holding unit to enhance flowing performance of cooling air and improve cooling efficiency.

Figure 9:
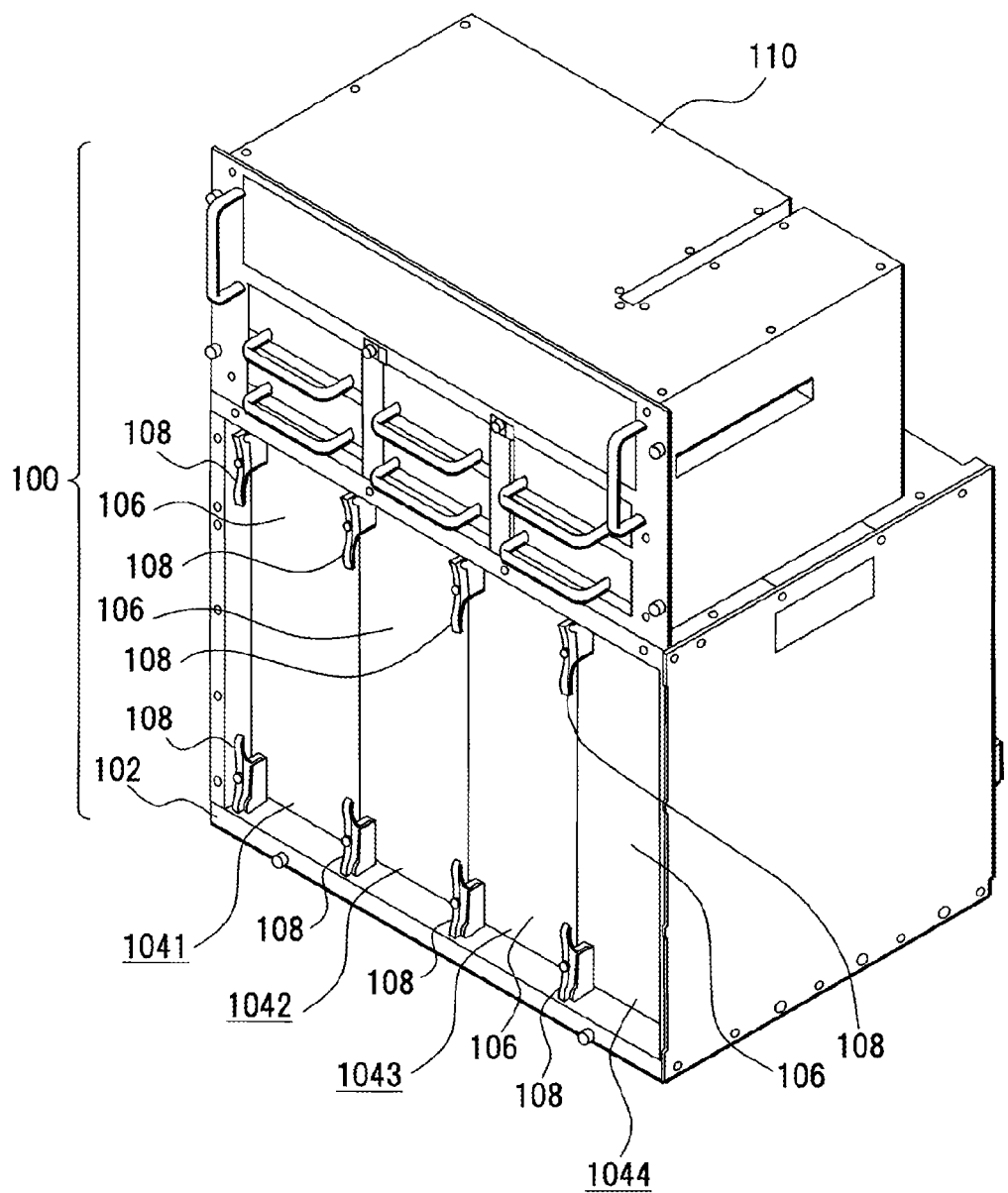
FIG. 9 is a perspective view of a server apparatus according to a first embodiment.
Figure 10:
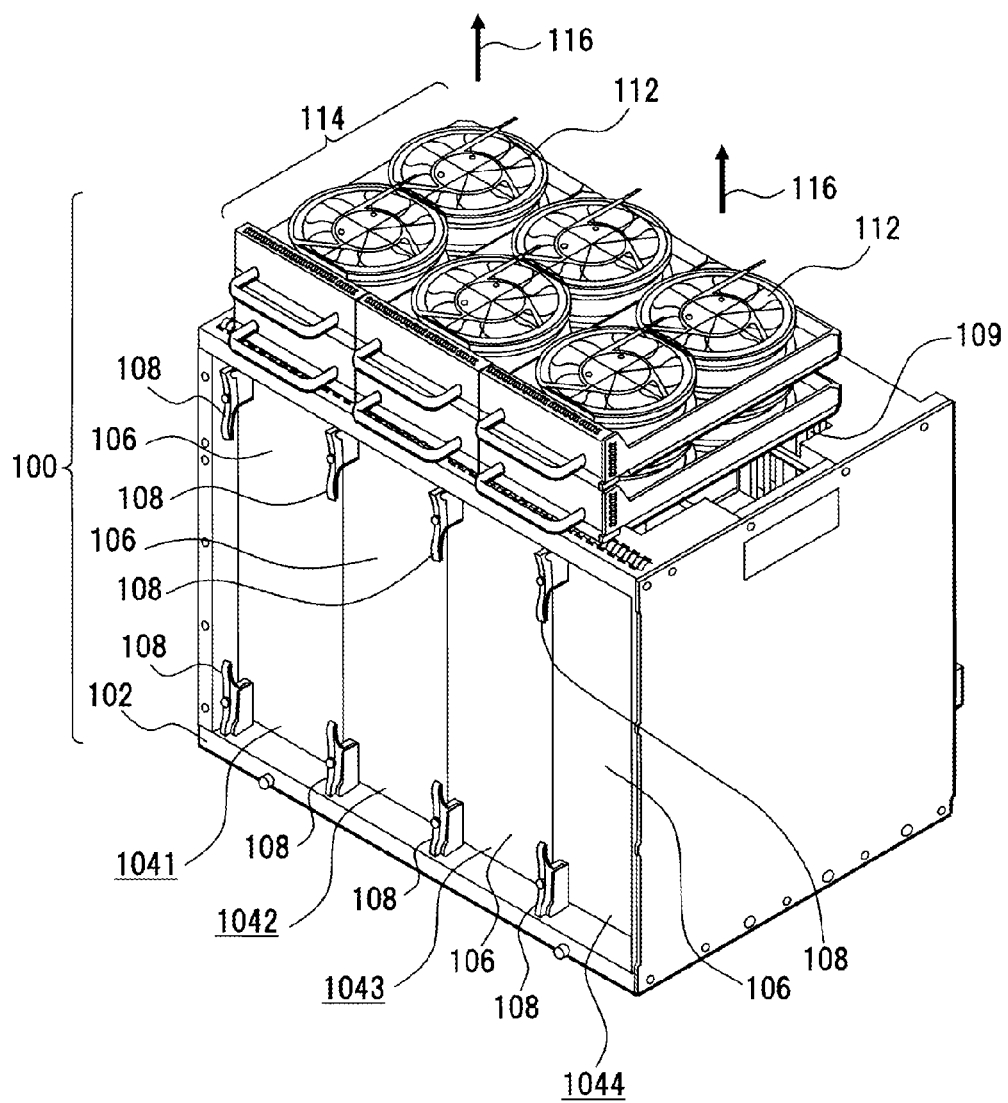
FIG. 10 is a perspective view of the server apparatus with a duct removed.

A first embodiment will be described with reference to FIGS. 9 and 10. FIG. 9 is a perspective view of a server apparatus according to the first embodiment and FIG. 10 is a perspective view of the server apparatus with a ventilation duct removed. The depicted configuration is an example and the present invention is not limited to this configuration.

A server apparatus 100 is an example of an apparatus including a rail supporting structure and a mounting structure of printed board units supported by rails and includes a rectangular-shaped housing 102 as depicted in FIG. 9. The housing 102 is disposed with a plurality of printed board units 1041, 1042, 1043 and 1044, which are slidable server units.

A front panel portion 106 making up an outer wall of each of the printed board units 1041 to 1044 is provided with a latch device 108 for individually fixing the printed board units 1041 to 1044 to the housing 102. By unlatching the latch device 108 (FIG. 23B), the printed board units 1041 to 1044 can individually be released from the housing 102 and the printed board units 1041 to 1044 become slidable in the front-back direction relative to the housing 102.

A ventilation duct 110 is disposed on the upper side of the housing 102, covering a ventilation hole 109 and, as depicted in FIG. 10, the ventilation duct 110 is disposed with a cooling fan device 114 combining a plurality of fan units 112. Air is sucked into the fan units 112 to allow cooling air 116 to flow through the printed board units 1041 to 1044 for heat radiation and cooling of heat generating parts 118 (FIG. 11) within the printed board units 1041 to 1044.

Figure 11:
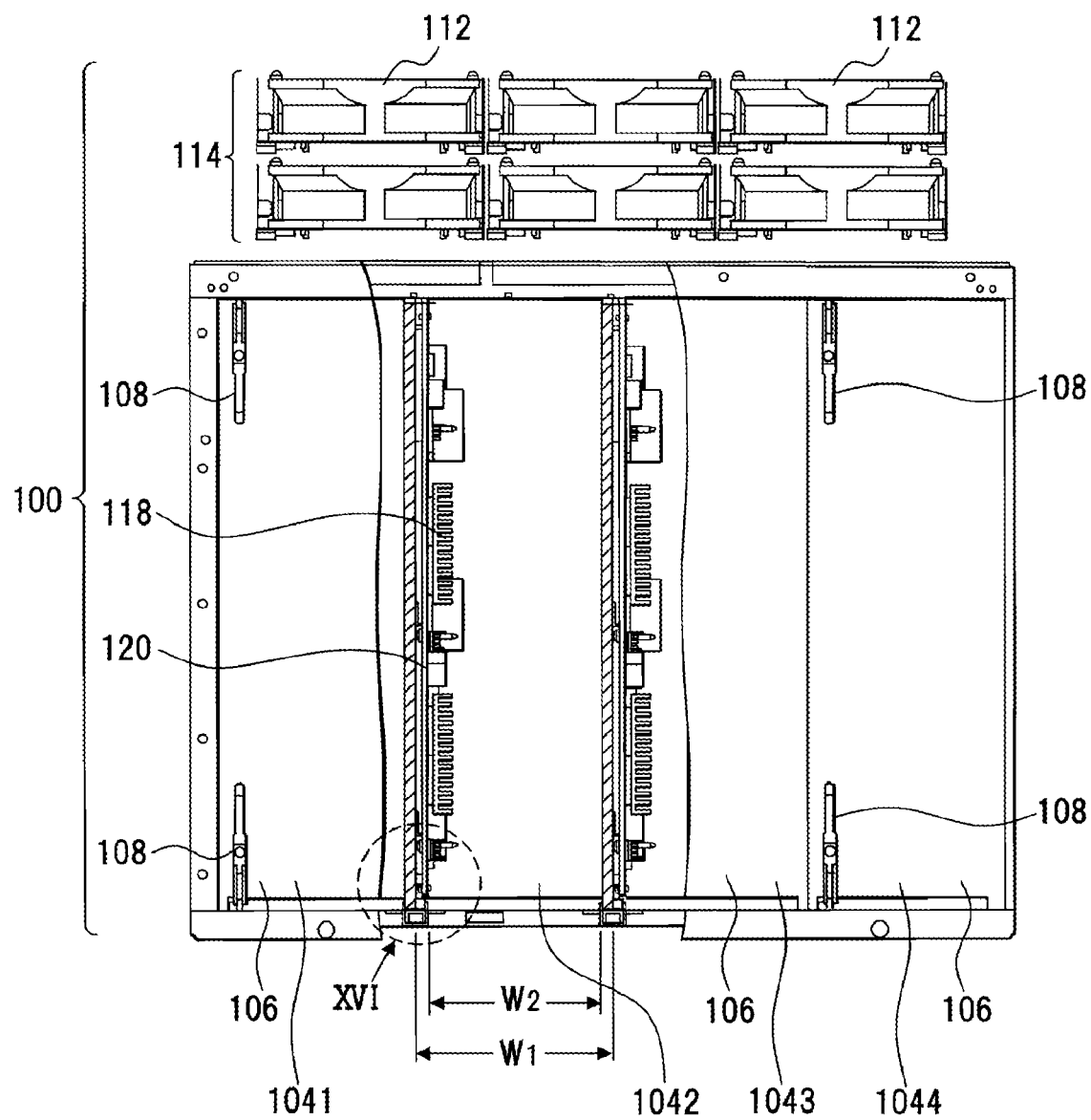
FIG. 11 is a partially cutaway view of the server apparatus according to the first embodiment.
Figure 12:
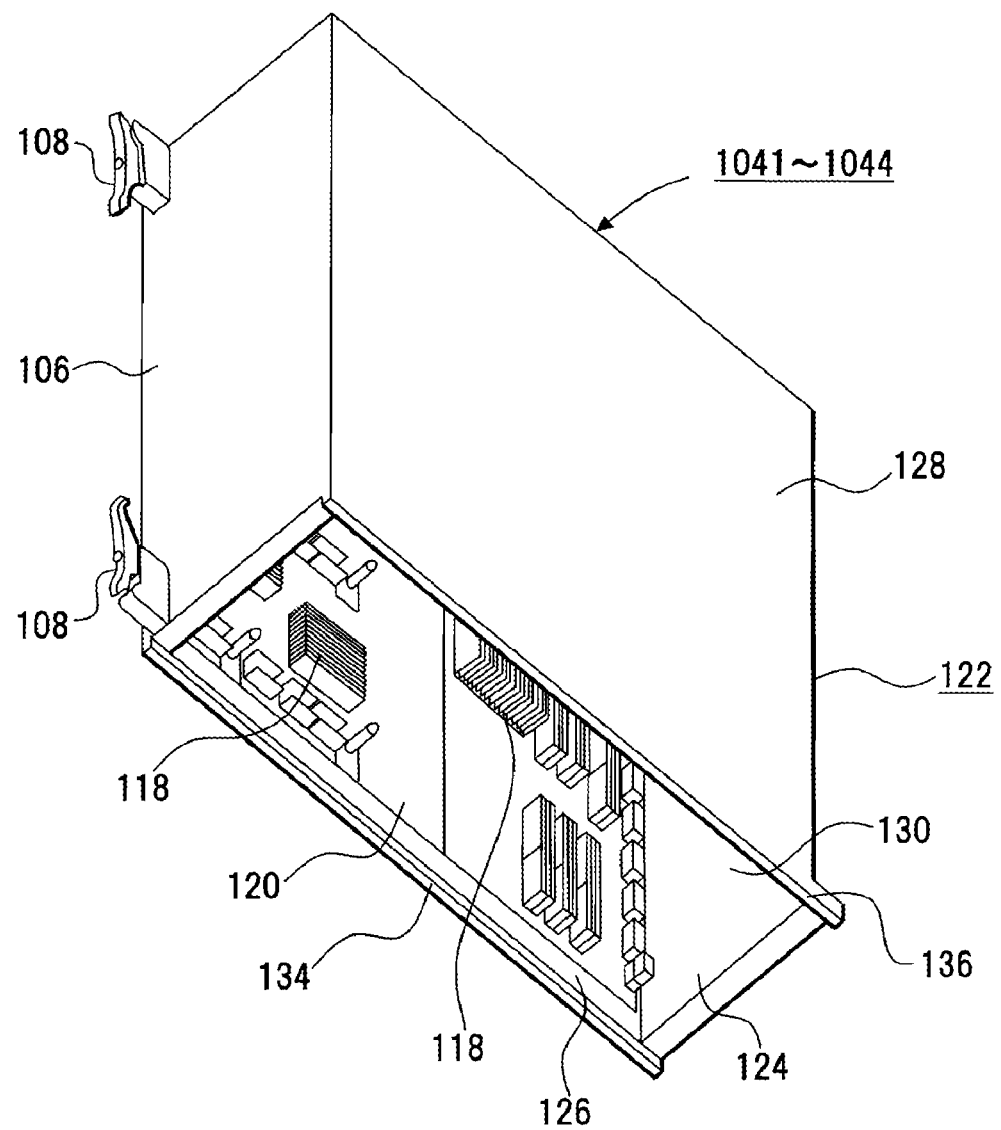
FIG. 12 is a diagram of a printed board unit.
Figure 13:
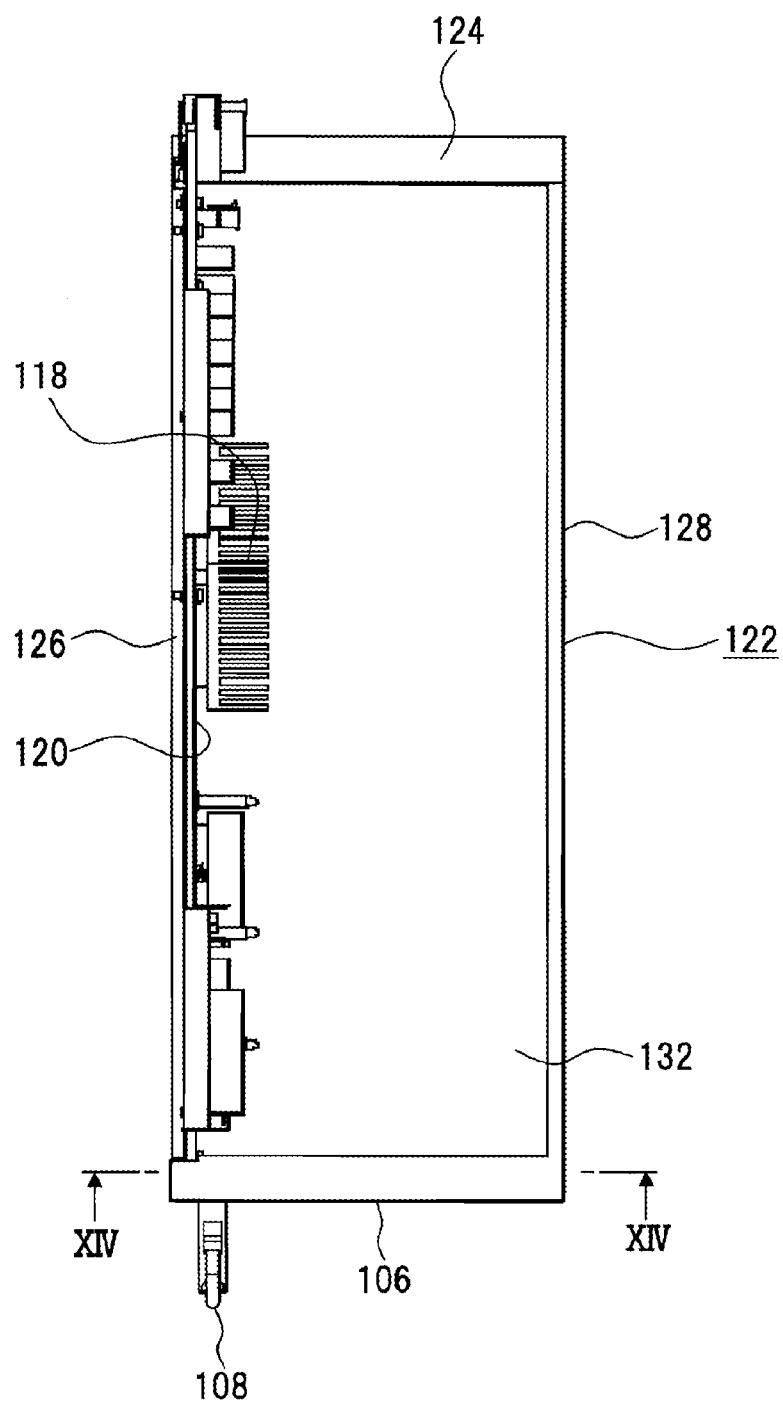
FIG. 13 is a plain view of the printed board unit.
Figure 14:
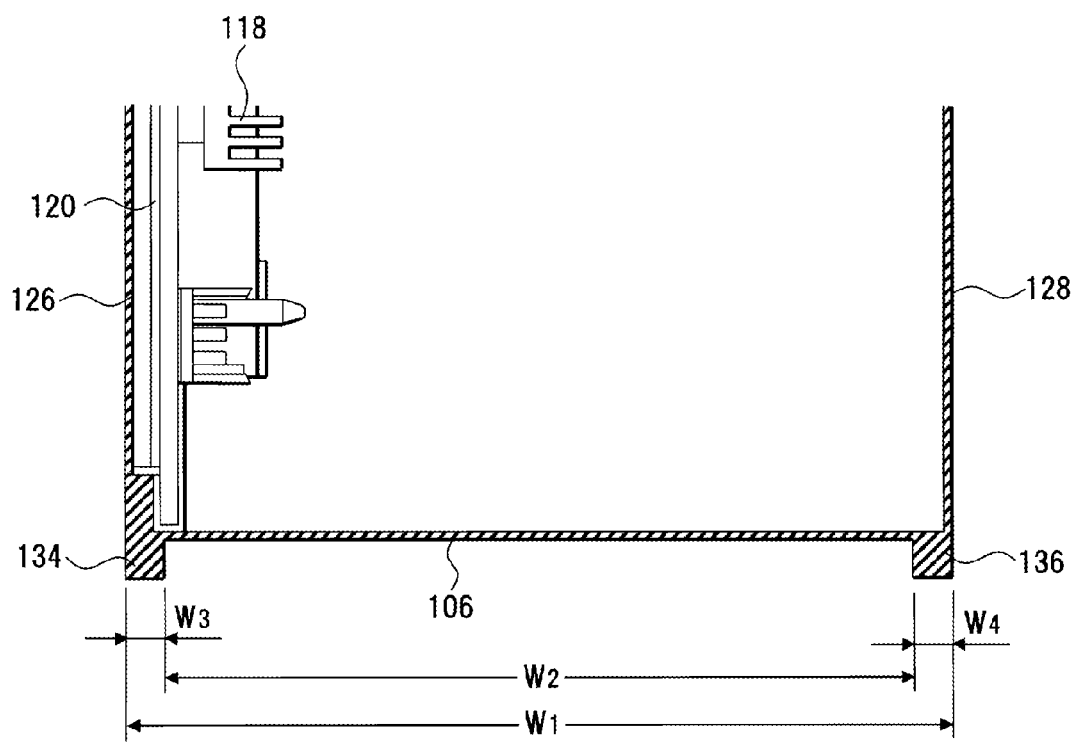
FIG. 14 is a cross-section diagram taken along line XIV-XIV of FIG. 13.

The printed board units 1041 to 1044 and the supporting structure thereof will be described with reference to FIGS. 11, 12, 13 and 14. FIG. 11 is a partially cutaway view of the server apparatus; FIG. 12 depicts the printed board unit; FIG. 13 is a plain view of the printed board unit; and FIG. 14 is a cross-section diagram taken along line XIV-XIV of FIG. 13. In FIGS. 11 to 14, the same portions as FIGS. 9 and 10 are denoted by the same reference numerals, respectively.

As depicted in FIG. 11, the printed board units 1041 to 1044 are respectively disposed with printed boards 120 and the above heat generating parts 118 are arranged on the printed boards 120.

As depicted in FIG. 12, each of the printed board units 1041 to 1044 includes a rectangular tubular frame 122, and the rectangular tubular frame 122 is made up of the front panel portion 106, a rear panel portion 124 and side wall portions 126 and 128, and has an opening 130 on the lower side and an opening 132 (FIG. 13) on the upper side. Each of the printed board units 1041 to 1044 has the printed board 120 arranged on the inner surface of the side wall portion 126 inside the frame 122.

A first rail 134 and a second rail 136 are arranged at a lower end (a first lower end or first side) of the side wall portion 126 and a lower end (a second lower end or second side) of the side wall portion 128, respectively, of the frame 122. That is, each of the printed board units 1041 to 1044 has the rail 134 arranged at the first lower end of the inner wall with the printed board 120 located thereon and the rail 136 arranged at the second lower end opposed to the first lower end in the opening 130 on the lower side of the frame 122. The rail 134 is disposed on the extension of the side wall portion 126 of the frame 122 and the rail 136 is disposed on the extension of the side wall portion 128 of the frame 122. When $W_1$ denotes the width of the frame 122 and $W_2$ denotes the width between the inner edges of the rails 134 and 136, the width between the outer edges of the rails 134 and 136 is identical to the width $W_1$ of the frame 122. In this case, when $W_3$ denotes the width of the rail 134 (FIG. 14) and $W_4$ denotes the width of the rail 136 (FIG. 14), if $W_3=W_4\equiv W$ is assumed in this embodiment, the width $W_2$ is as follows:

$$W_2=W_1-W_3-W_4=W_1-2\times W \quad (2)$$

The widths $W_3$ and $W_4$ may be differentiated considering that the heavy parts are loaded on the side wall portion 126 side.

Figure 15:
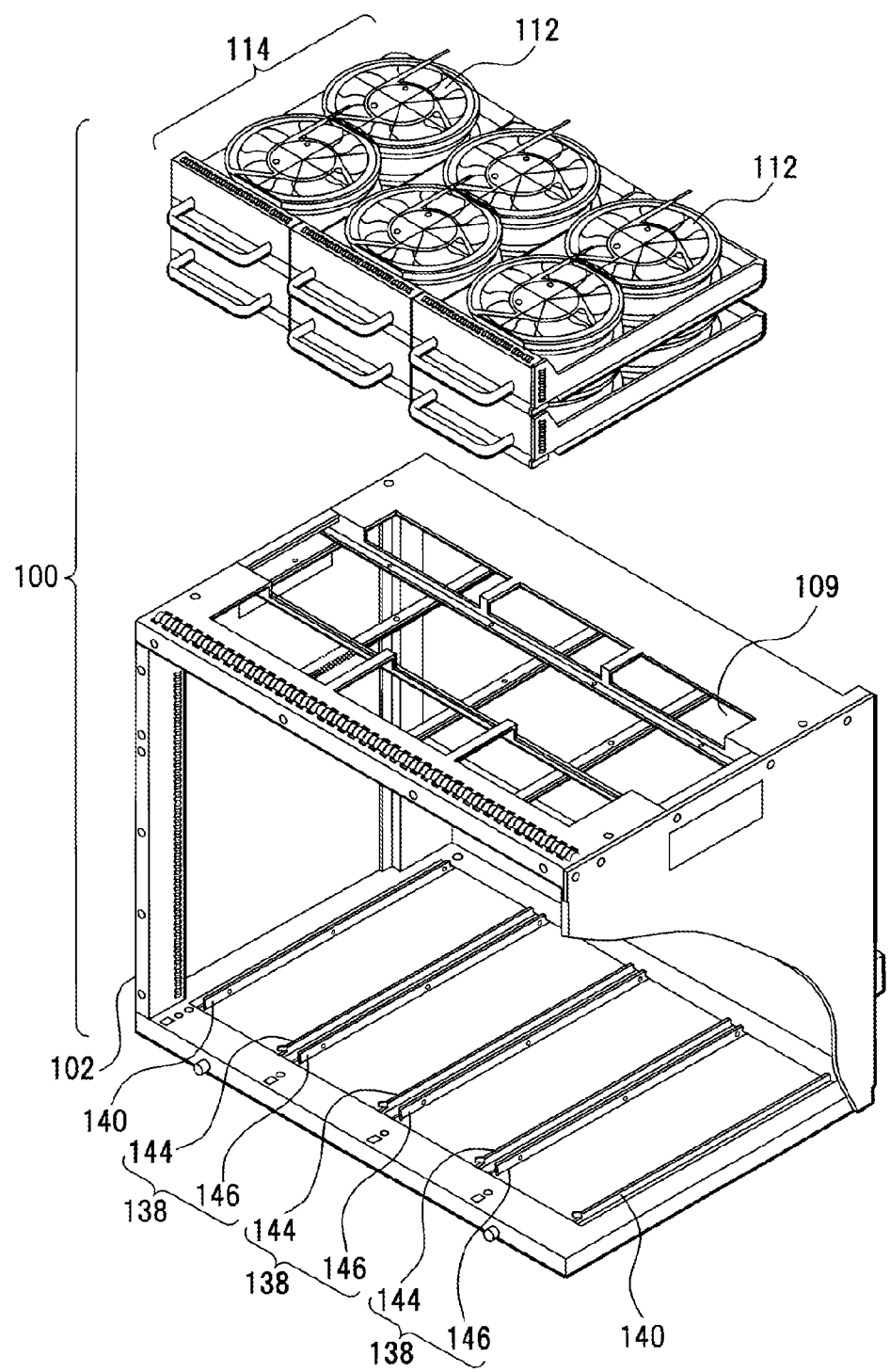
FIG. 15 is partially cutaway view of a housing and a cooling fan device.
Figure 16:
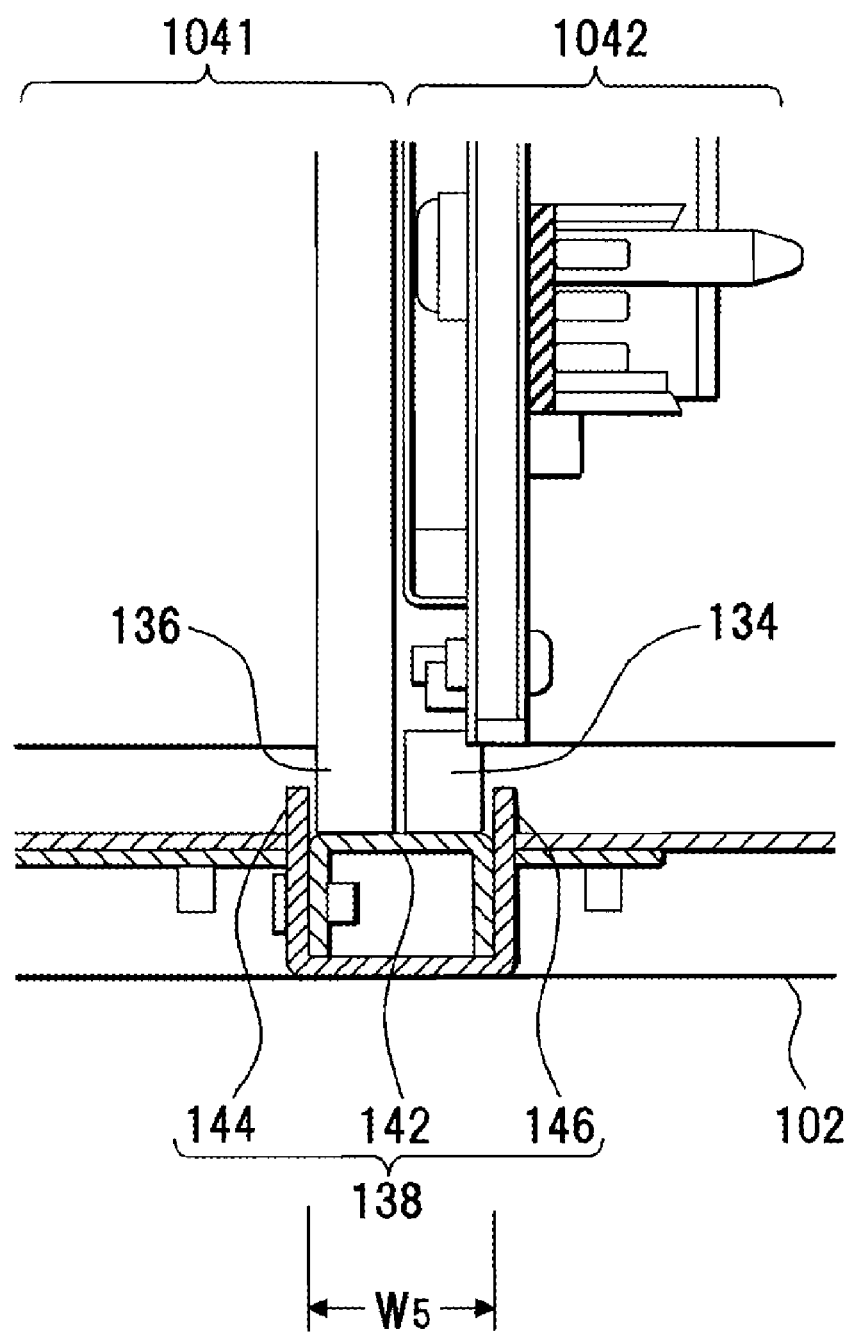
FIG. 16 is an enlarged cross-section diagram of a rail supporting structure of portion XVI of FIG. 11.
Figure 17:
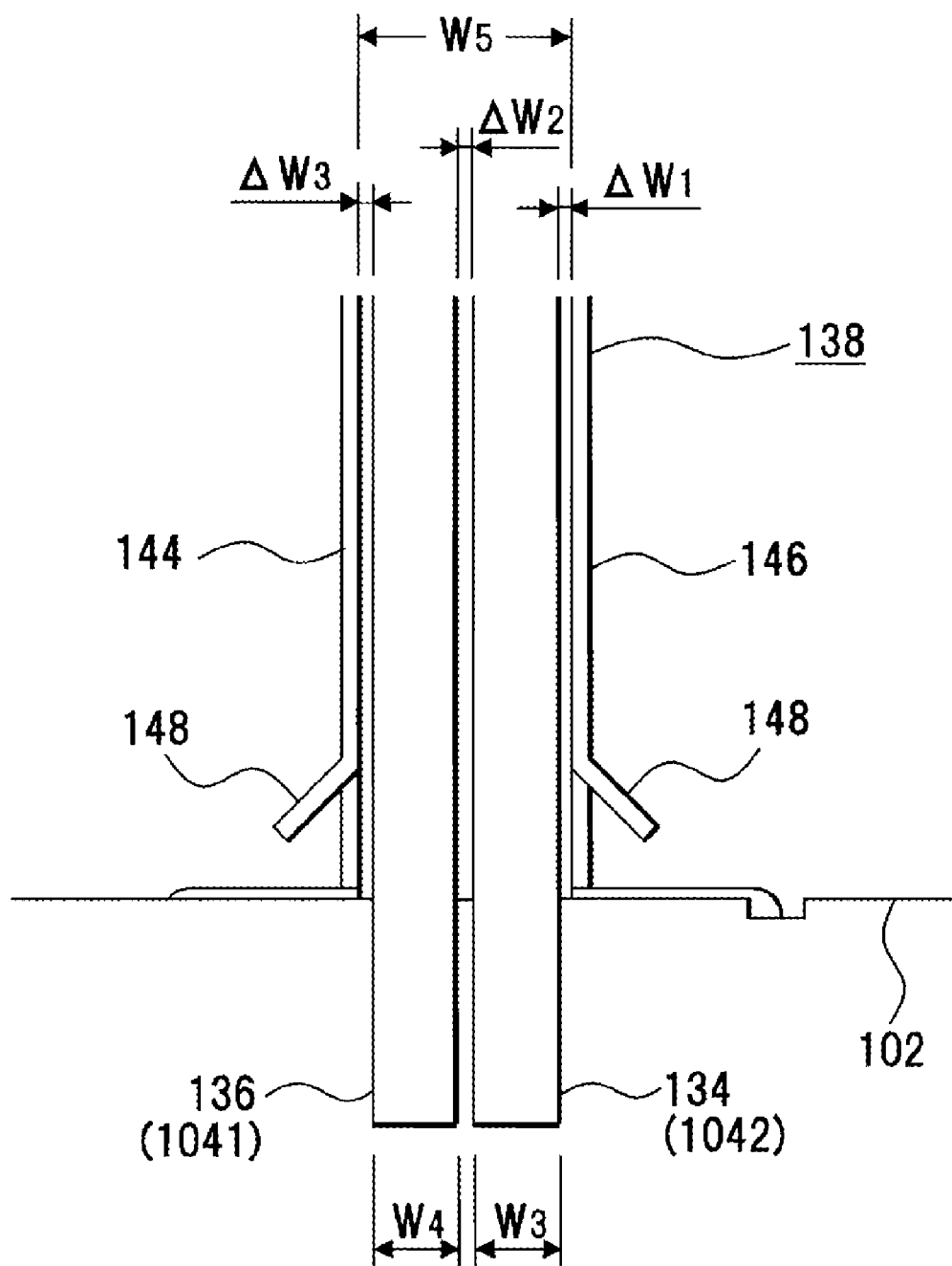
FIG. 17 is a diagram of a rail supporting unit of adjacent rails.
Figure 18:
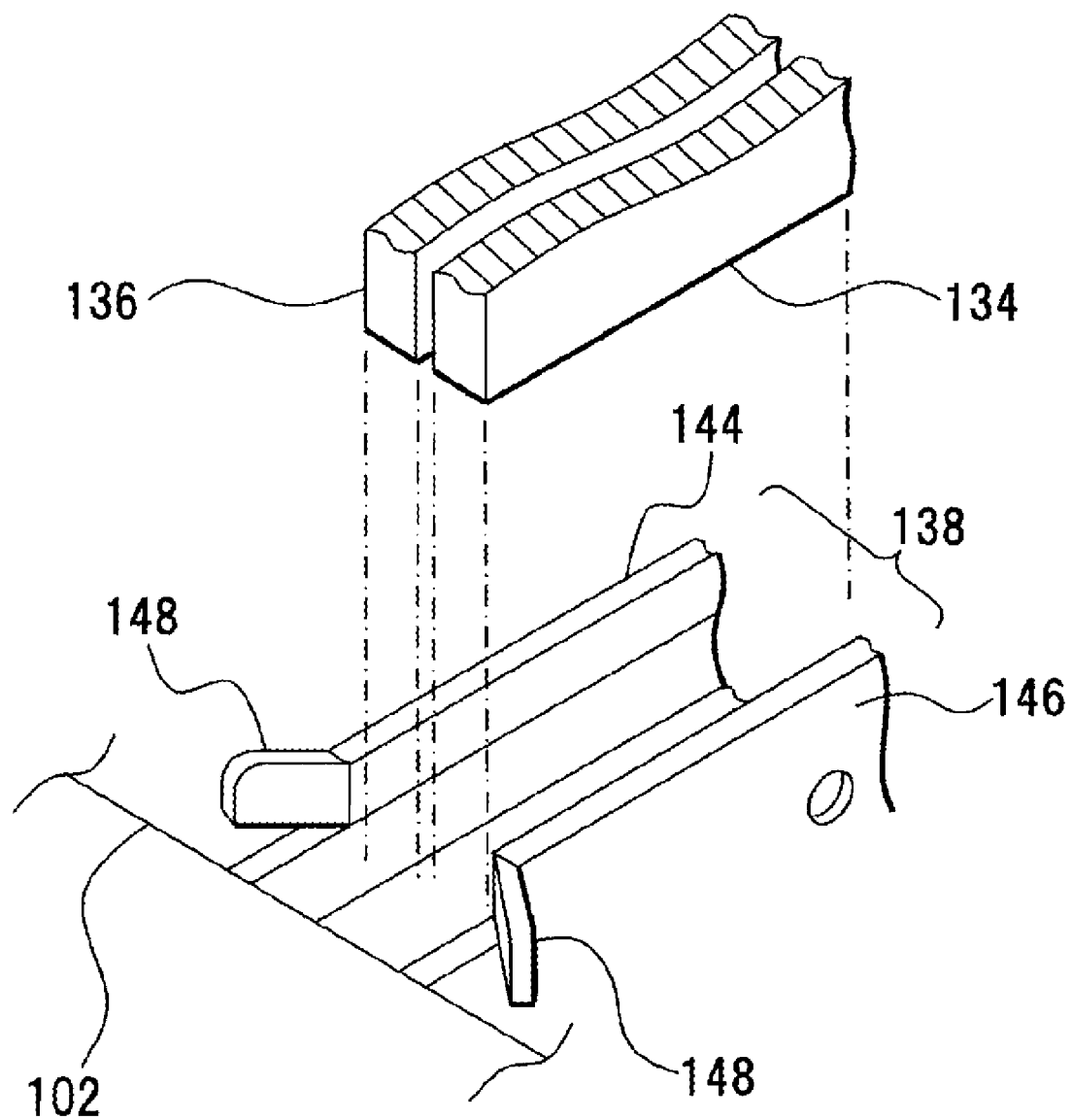
FIG. 18 is an exploded perspective view of the rail supporting unit of the adjacent rails.

The housing and the rail supporting structure will be described with reference to FIGS. 15, 16, 17 and 18. FIG. 15 is partially cutaway view of the housing and the cooling fan device; FIG. 16 is an enlarged cross-section diagram of the rail supporting structure of portion XVI of FIG. 11; FIG. 17 depicts a rail supporting unit of adjacent rails; and FIG. 18 is an exploded perspective view of the rail supporting unit of the adjacent rails. In FIGS. 15 to 18, the same portions as FIGS. 9 and 14 are denoted by the same reference numerals.

As depicted in FIG. 15, the ceiling plane of the housing 102 has the ventilation hole 109 formed to allow the cooling fan device 114 to exhaust the cooling air 116 (FIG. 10) from the housing 102. The bottom surface of the housing 102 is disposed with a plurality of guide rails 138 and 140 corresponding to a plurality of the printed board units 1041 to 1044.

The guide rail 138 is a rail holding unit as depicted in FIG. 16. The guide rail 138 holds the first rail 134 of the printed board unit 1042, which is a first printed board unit, and the second rail 136 of the printed board unit 1041, which is a second printed board unit adjacent to the first printed board unit movably, and may have a cross-section in the shape conforming or approximate to a square U-shape.

The guide rail 138 is disposed with a rail receiver 142 with a cross-section of square U-shape that receives the rails 134 and 136, and is disposed with upright wall portions 144 and 146 erected with the rail receiver 142 located therebetween. When $W_5$ denotes a distance between the upright wall portions 144 and 146, as depicted in FIG. 17, the distance $W_5$ is expressed as follows:

$$W_5 > W_3+W_4=2\times W \quad (3)$$

$$W_5-(W_3+W_4)=\Delta W \quad (4)$$

$$\Delta W=\Delta W_1+\Delta W_2+\Delta W_3 \quad (5)$$

$\Delta W$ is a margin width for sliding the rails 134 and 136. $\Delta W$ is formed between the rails 134 and 136, between the rail 134 and the upright wall portion 146, and between the rail 136 and the upright wall portion 144.

The guide rail 138 as above is disposed between the printed board unit 1041 and the printed board unit 1042, between the printed board unit 1042 and the printed board unit 1043, and between the printed board unit 1043 and the printed board unit 1044.

Assuming that n denotes the number of disposed printed board units in the housing 102, when $r_1$ denotes the number of the rails of all the units and g denotes the number of the guide rails, since the number g of the guide rails is the same as the number $r_1$ of the rails ($g=r_1$) in the conventional server apparatus (FIG. 1), the number $r_1$ of the rails is $$r_1=g=2n \quad (6)$$

Since the guide rail 138 is shared between the adjacent units in the above embodiment, when $r_2$ denotes the number of the rails of all the units, $$r_2=n+1 \quad (7)$$

The rate $r_2/r_1$ of the number of the rails is as follows:

$$r_2/r_1=(n+1)/2n \quad (8)$$

Therefore, assuming n=4, since $r_2=5$ is achieved while $r_1=8$, the number of the rails is significantly lowered and is reduced by 30 percent or more.

Since no adjacent rail exists on the side of the rail 134 of the printed board unit 1041 and the side of the rail 136 of the printed board unit 1044 in this embodiment, a narrow guide rail 140 is disposed as depicted in FIG. 15.

As depicted in FIGS. 17 and 18, the guide rail 138 is the rail holding unit and has a guide 148 that guides the two adjacent rails 134 and 136. The guide 148 is formed by cutting and raising the upright wall portions 144 and 146 of the guide rail 138 and has a structure conforming or approximate to a truncated V-shape spreading toward the end.

Figure 19:
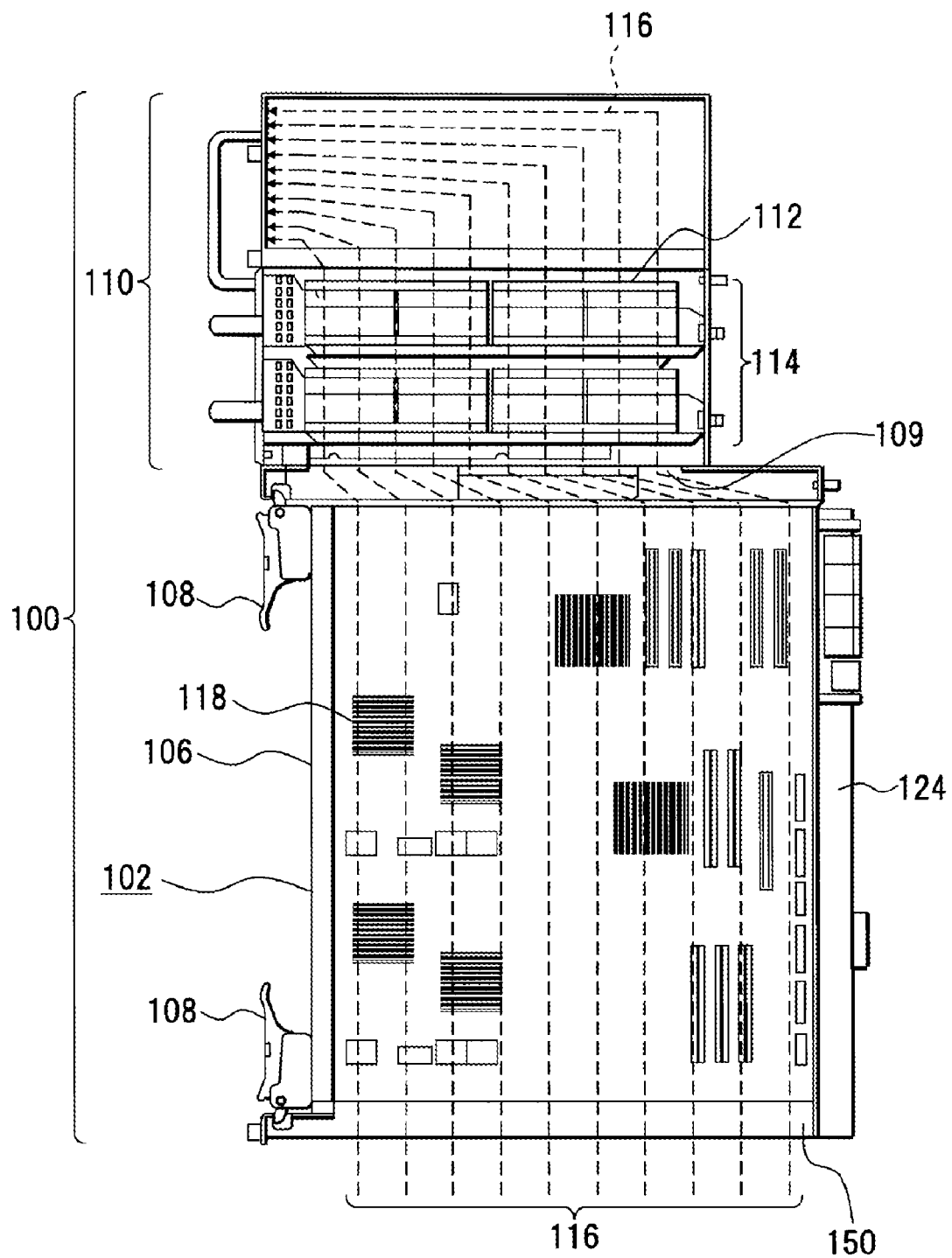
FIG. 19 is a diagram of a flow of cooling air flowing through the server apparatus and the duct.
Figure 20:
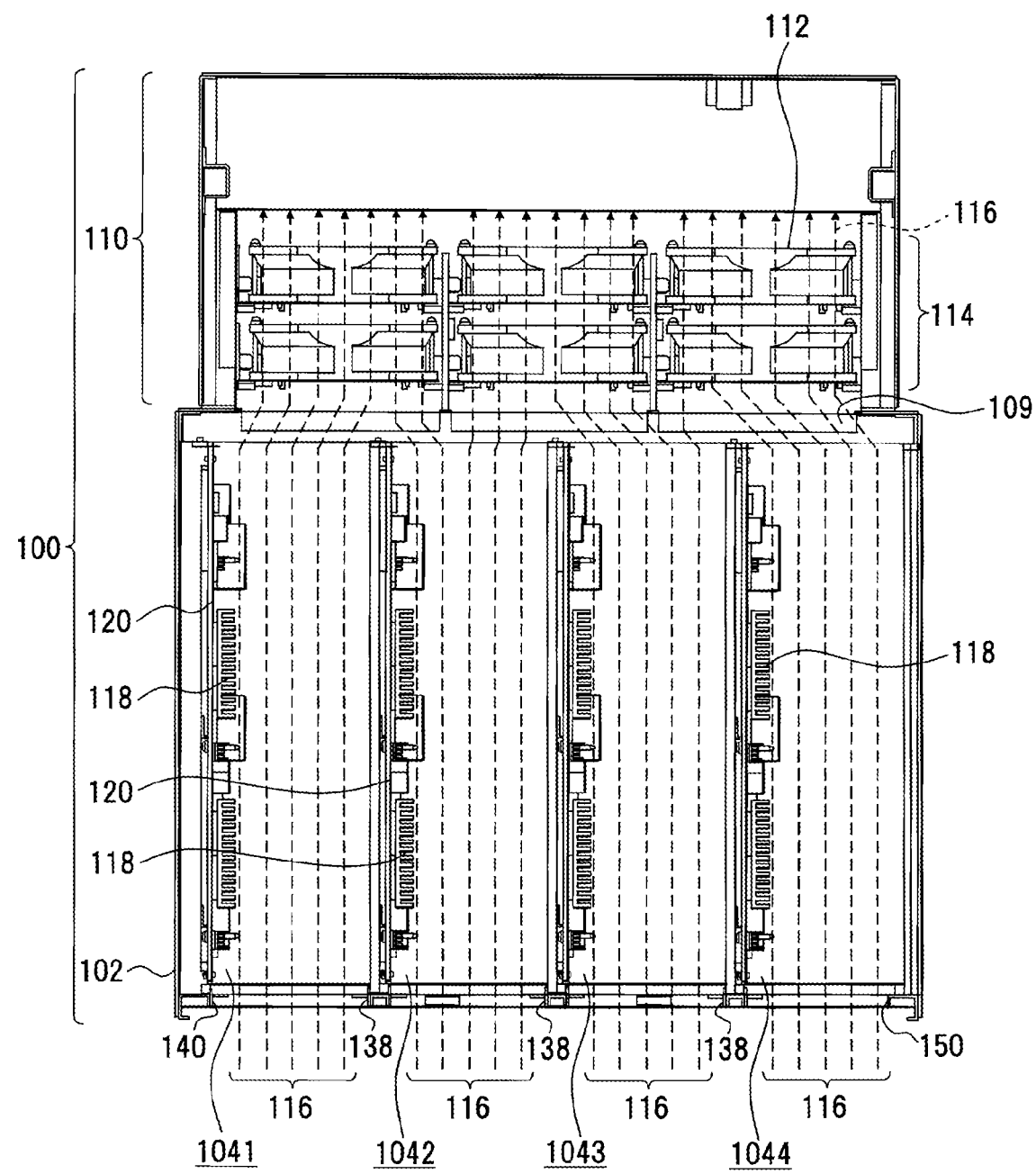
FIG. 20 is a diagram of the flow of the cooling air flowing through the server apparatus and the duct.

A flow of cooling air will be described with reference to FIGS. 19 and 20. FIGS. 19 and 20 depict a flow of cooling air flowing through the server apparatus and the duct. In FIGS. 19 and 20, the same portions as FIGS. 9 to 11 are denoted by the same reference numerals.

When the fan units 112 of the cooling fan device 114 are activated, the cooling air 116 is sucked into the housing 102 from an air supply opening 150 of the housing 102 as depicted in FIG. 19. The cooling air 116 passes through the printed board units 1041 to 1044, flows from the ventilation hole 109 to the cooling fan device 114, and is exhausted from the ventilation duct 110 into the outside air. The heat generating parts 118, etc., disposed on the printed boards 120 of the printed board units 1041 to 1044 touch the cooling air 116 and is cooled since the heat radiation is promoted.

In the flow passage of the cooling air 116 flowing through the housing 102 and the printed board units 1041 to 1044, the guide rails 138 shared by the adjacent rails 134 and 136 (FIG. 16) are disposed between the printed board units (between 1041 and 1042, between 1042 and 1043, and between 1043 and 1044), i.e., between the printed board unit 1041 and the printed board unit 1042, between the printed board unit 1042 and the printed board unit 1043, and between the printed board unit 1043 and the printed board unit 1044 as depicted in FIG. 20. Therefore, no gap exists between the printed board units (between 1041 and 1042, between 1042 and 1043, and between 1043 and 1044), i.e., between the printed board unit 1041 and the printed board unit 1042, between the printed board unit 1042 and the printed board unit 1043, and between the printed board unit 1043 and the printed board unit 1044, and the cooling air 116 flows through only the inside of the frames 122 (FIG. 12) of the printed board units 1041 to 1044 and the cooling by the cooling air 116 is achieved. That is, the server apparatus 100 has an increased area for sucking the cooling air 116 for the printed board units 1041, 1042, 1043 and 1044 and, therefore, the air flow rate is increased and the cooling efficiency is enhanced. This contributes to the operational stability of the server apparatus 100.

Figure 1:
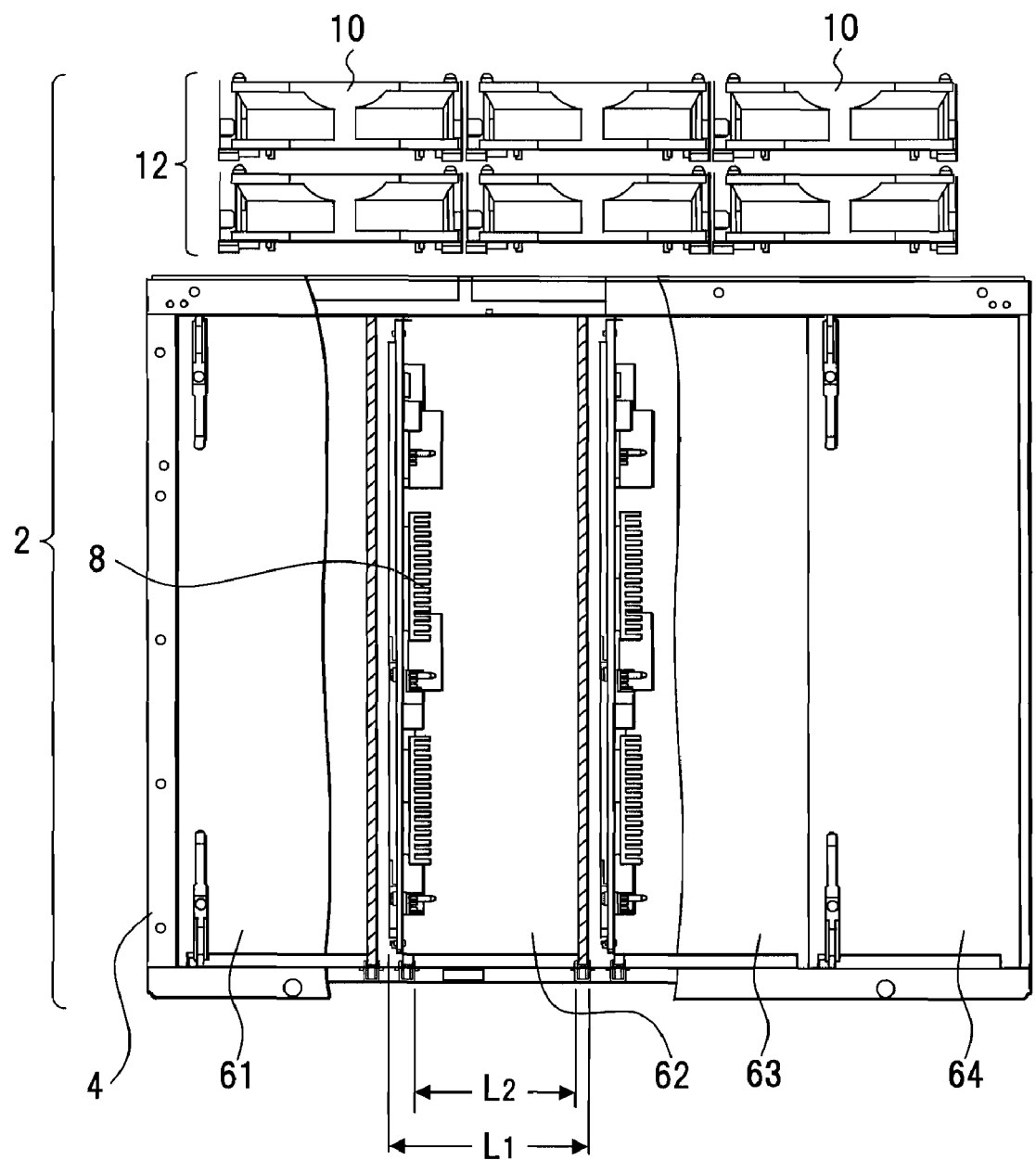
FIG. 1 is a partially cutaway view of a conventional server apparatus.
Figure 2:
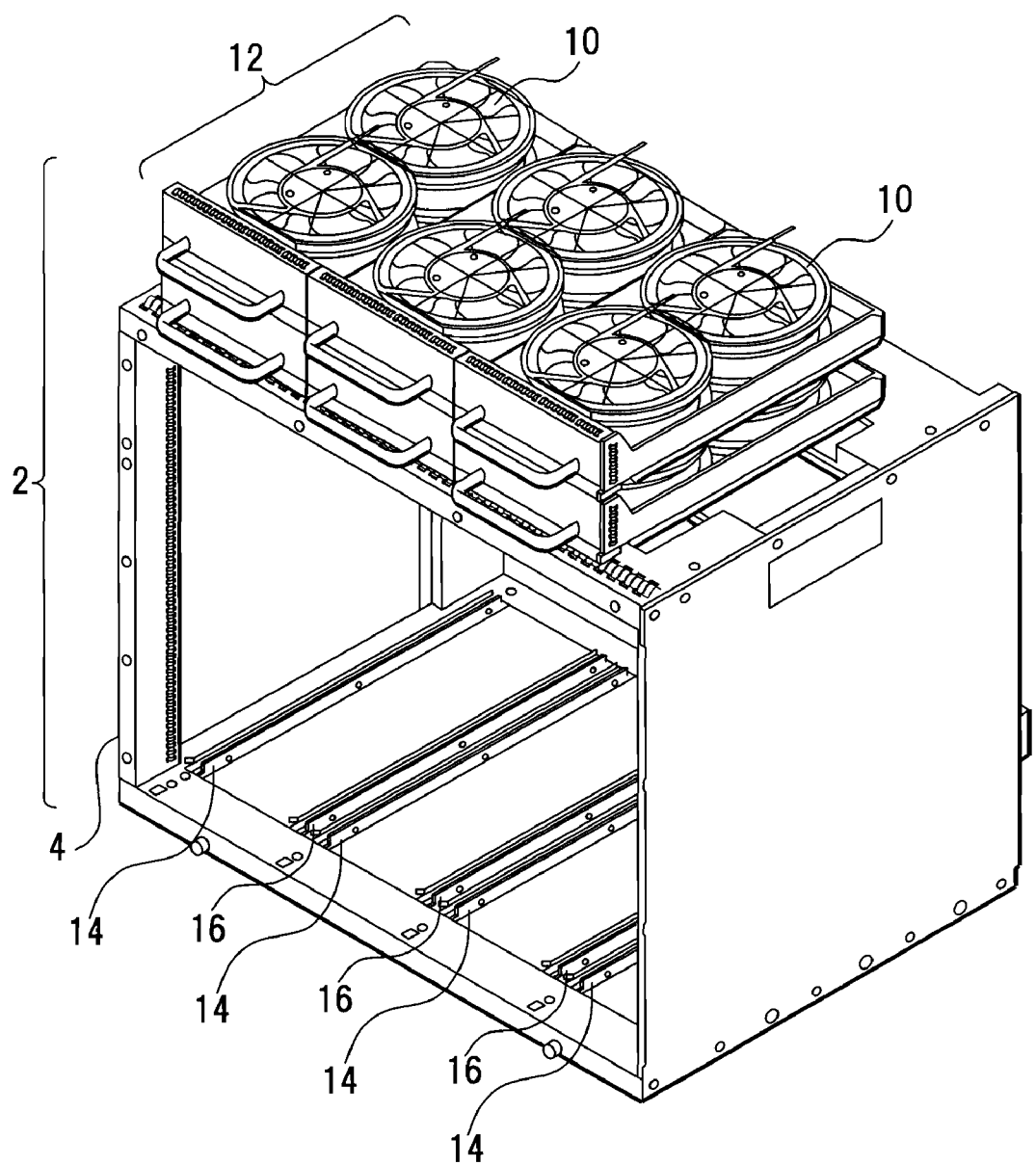
FIG. 2 is a diagram of the conventional server apparatus with printed board units pulled away.
Figure 3:
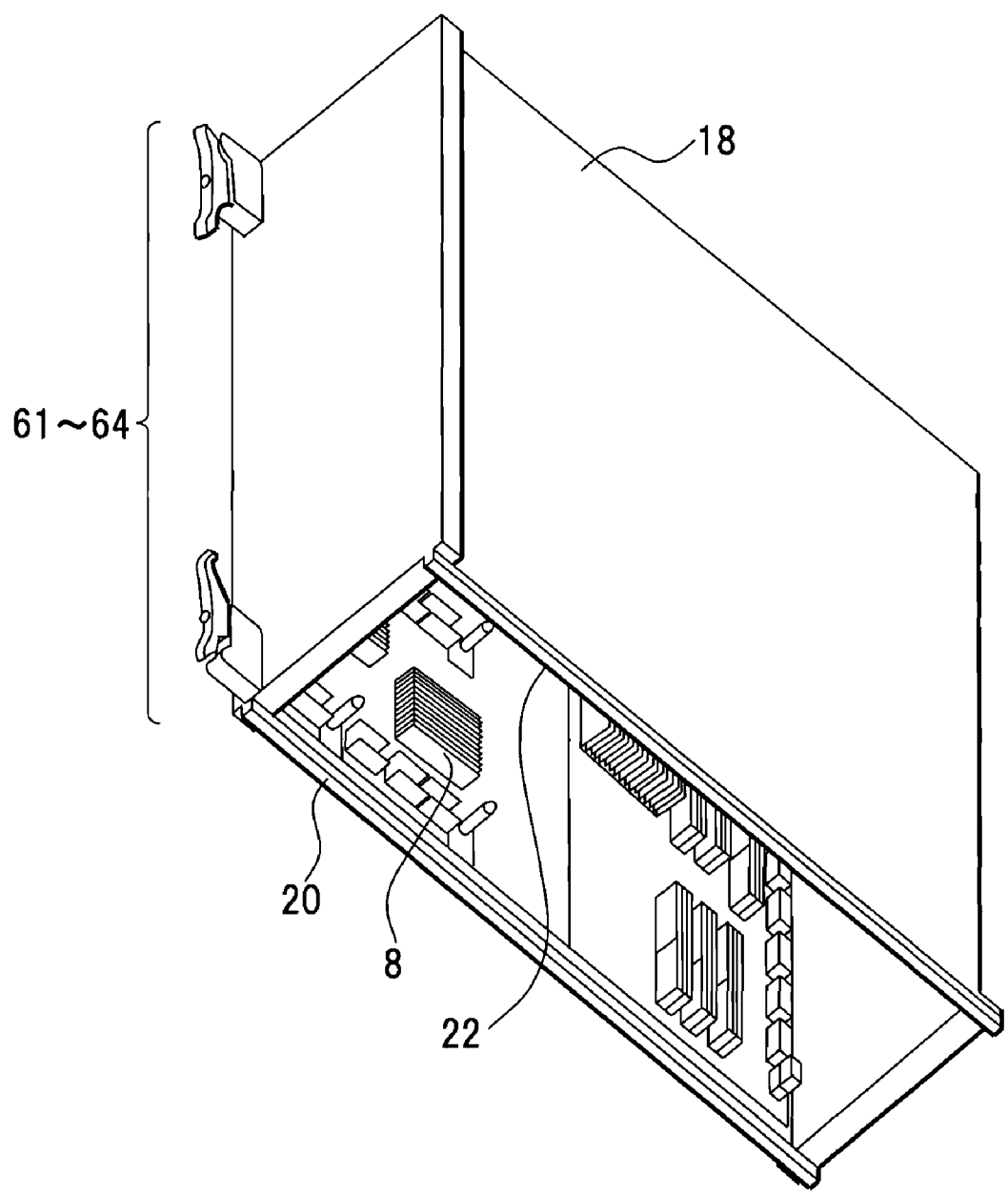
FIG. 3 is a diagram of a conventional printed board unit.
Figure 4:
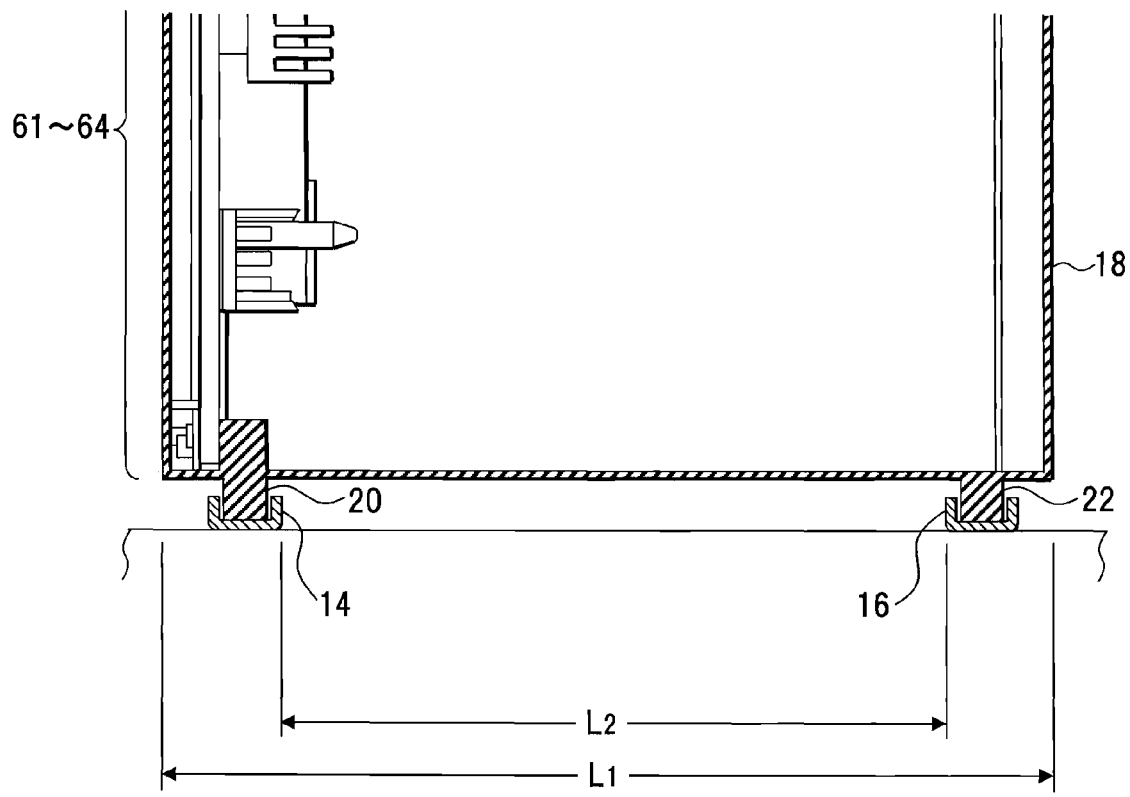
FIG. 4 is a cross-section diagram of a rail supporting portion of the conventional printed board unit.
Figure 21A:
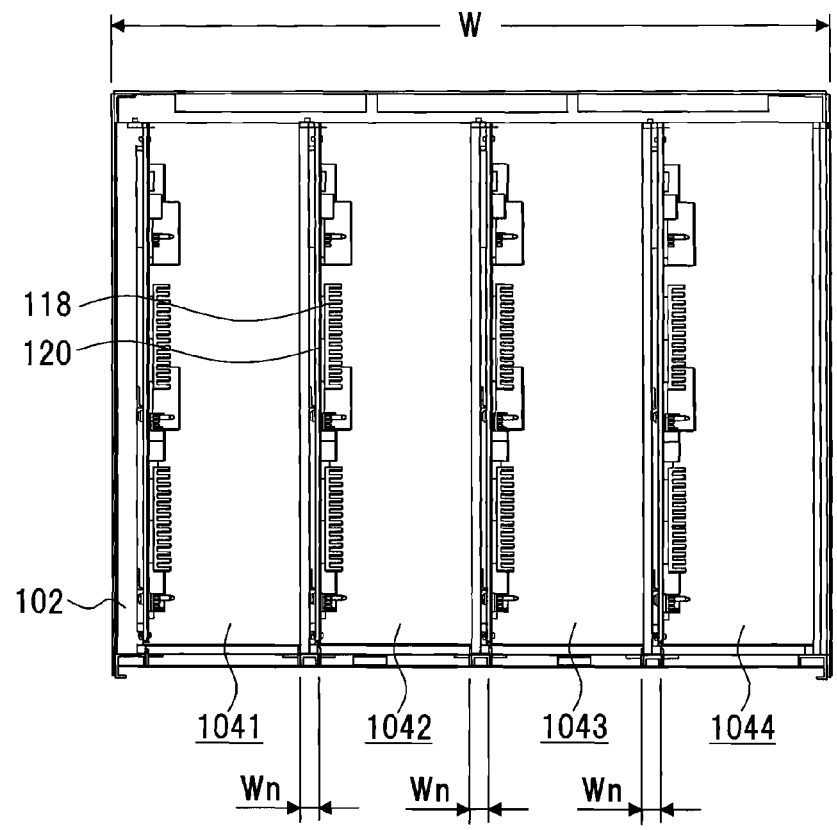
FIGS. 21A and 21B are diagrams of the arrangement of the printed board units of the server apparatus according to the first embodiment and the arrangement of the printed board units of the conventional server apparatus.
Figure 21B:
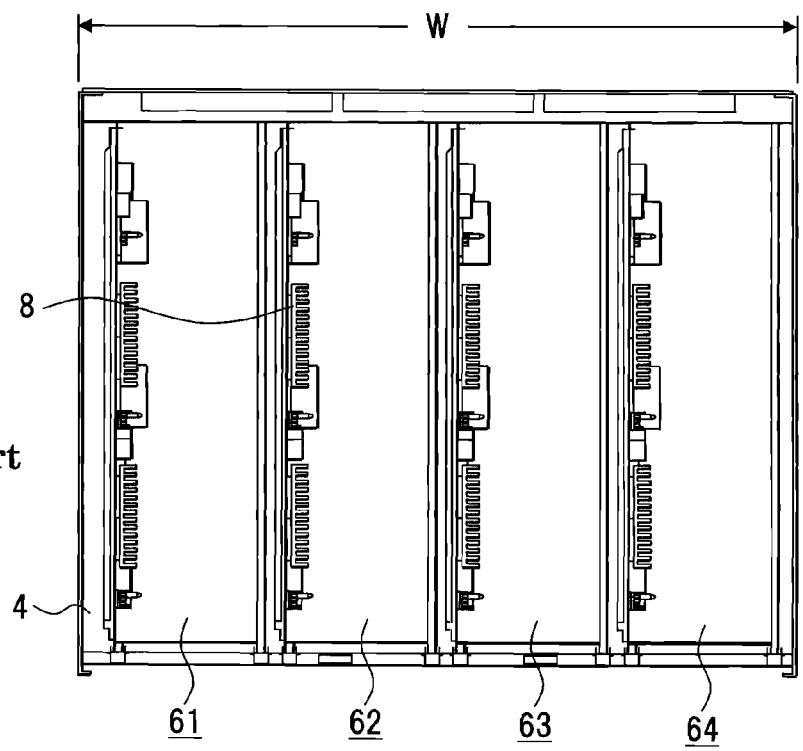
Figure 22A:
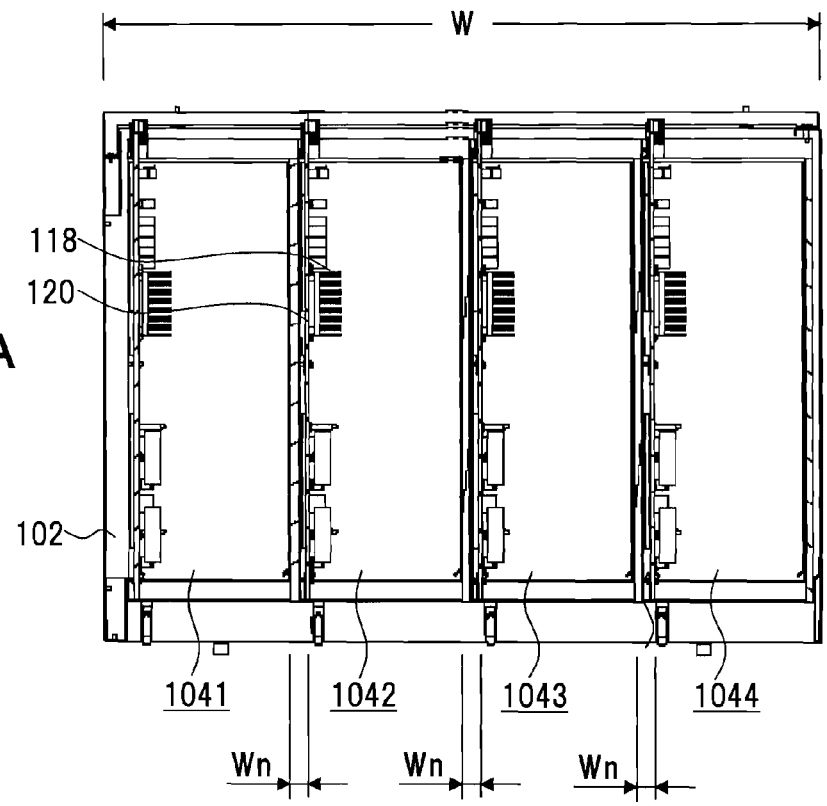
FIGS. 22A and 22B are diagrams of the arrangement of the printed board units of the server apparatus according to the first embodiment and the arrangement of the printed board units of the conventional server apparatus.
Figure 22B:
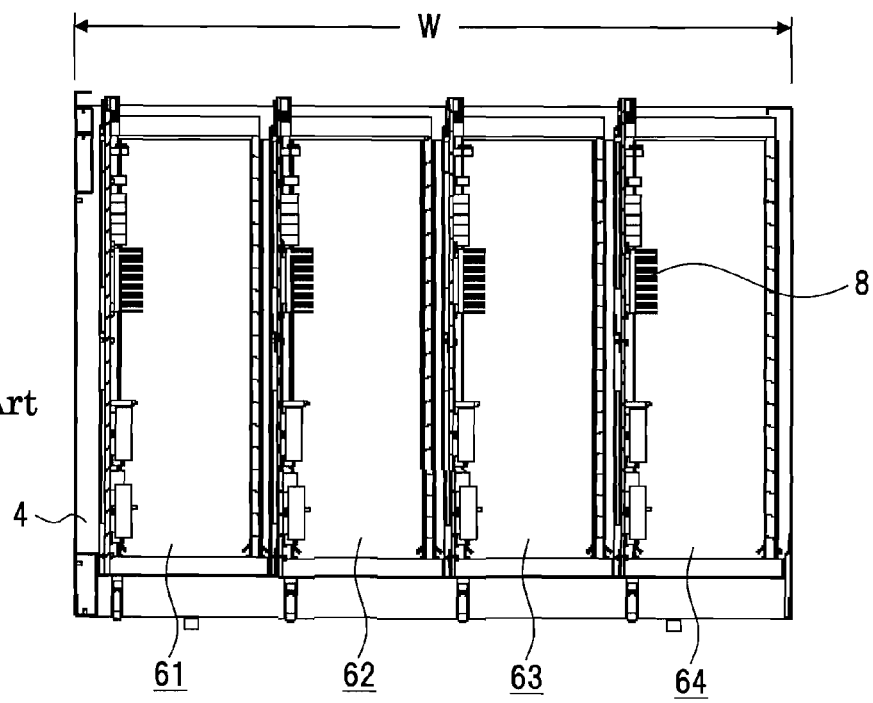

The occupation space of the printed board units 1041 to 1044 in the housing 102 will be described with reference to FIGS. 21A to 22B. FIGS. 21A and 22A depict the arrangement of the printed board units of the server apparatus according to the first embodiment and FIGS. 21B and 22B depict the arrangement of the printed board units of the conventional server apparatus. In FIGS. 21A and 22A, the same portions as FIGS. 9 to 13 are denoted by the same reference numerals. In FIGS. 21B and 22B, the same portions as FIGS. 1 to 3 are denoted by the same reference numerals.

As depicted in FIGS. 21A and 22A, the guide rails 138 on the unit distance sides are unified and shared, and the distances of the adjacent units are narrowed for the printed board units 1041 to 1044 disposed in the housing 102. As a result, the occupation space of the printed board units 1041 to 1044 is expanded in the housing 102.

Figure 5:
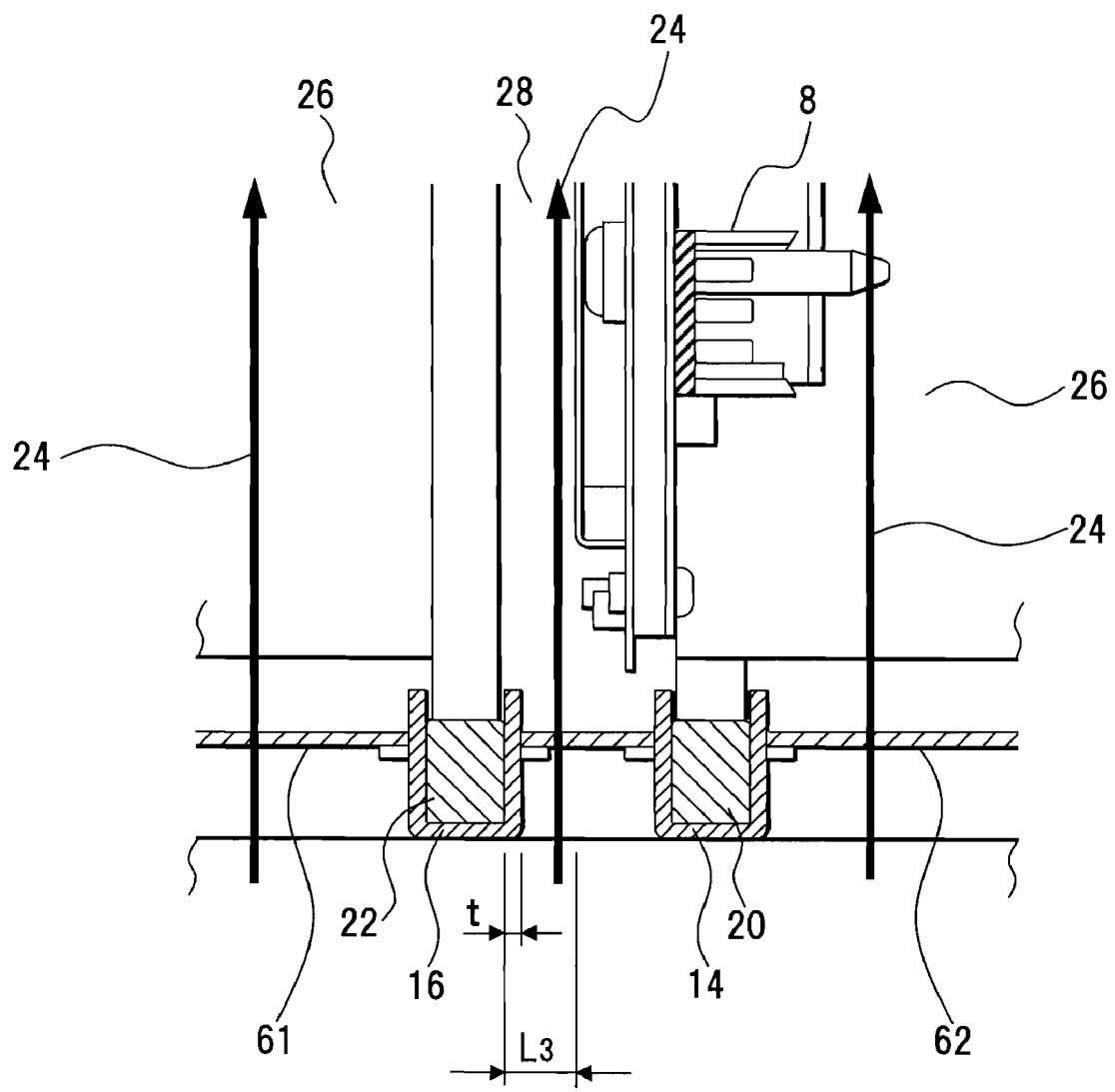
FIG. 5 is a diagram of the rail supporting portion of the conventional printed board unit and a flow of cooling air.
Figure 6:
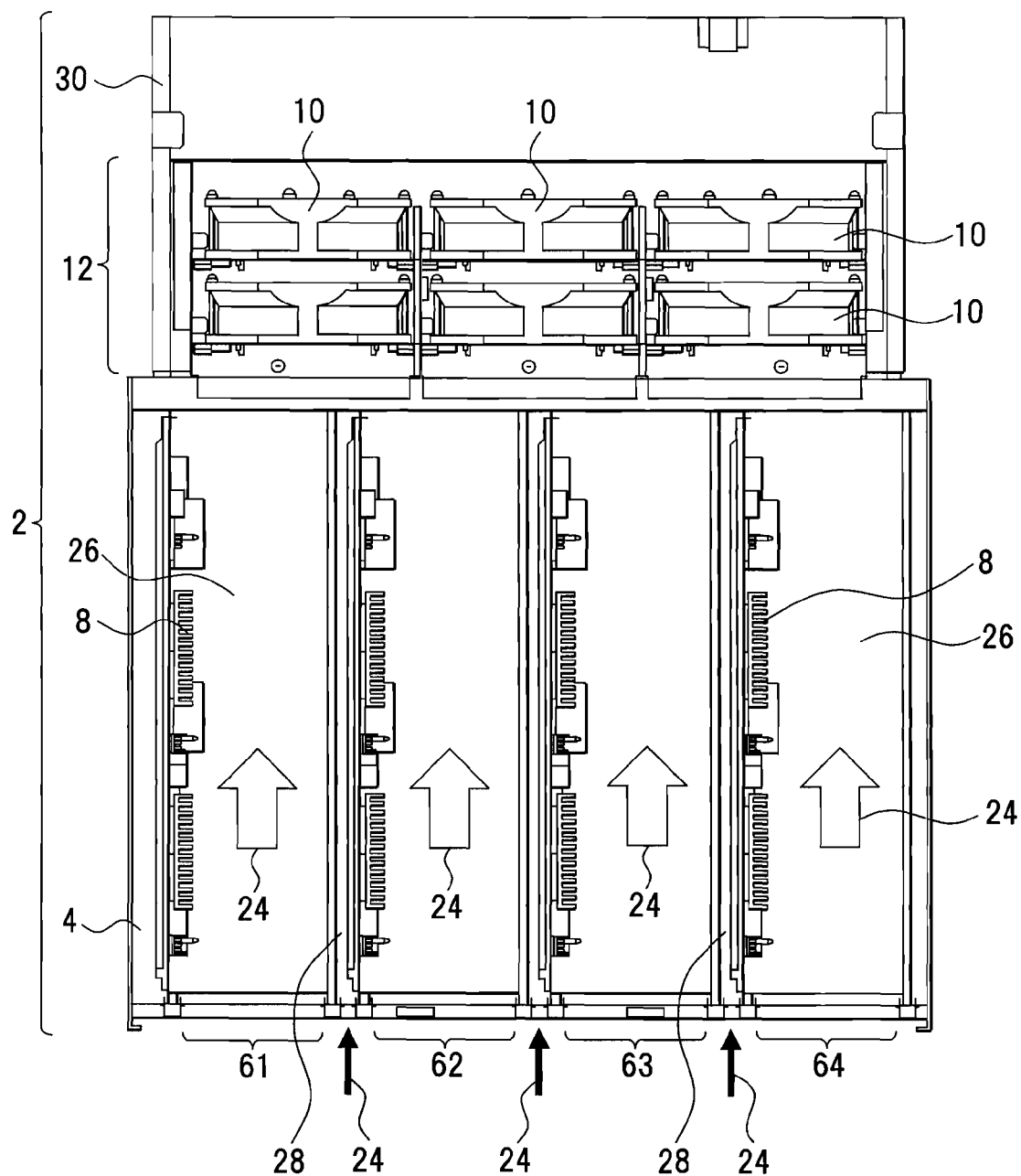
FIG. 6 is a diagram of a flow of the cooling air in the conventional server apparatus.
Figure 7:
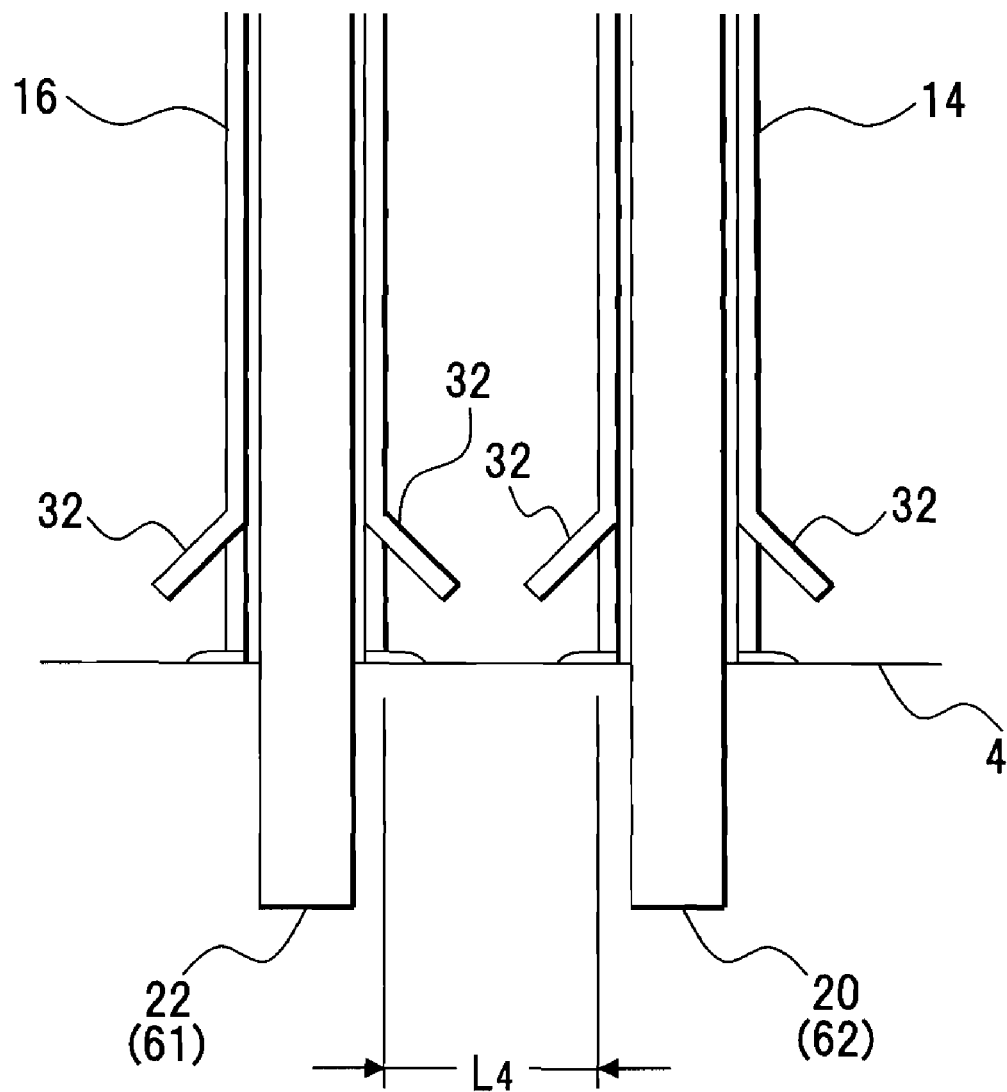
FIG. 7 is a diagram of portions of rails and guide rails of the conventional server apparatus.
Figure 8:
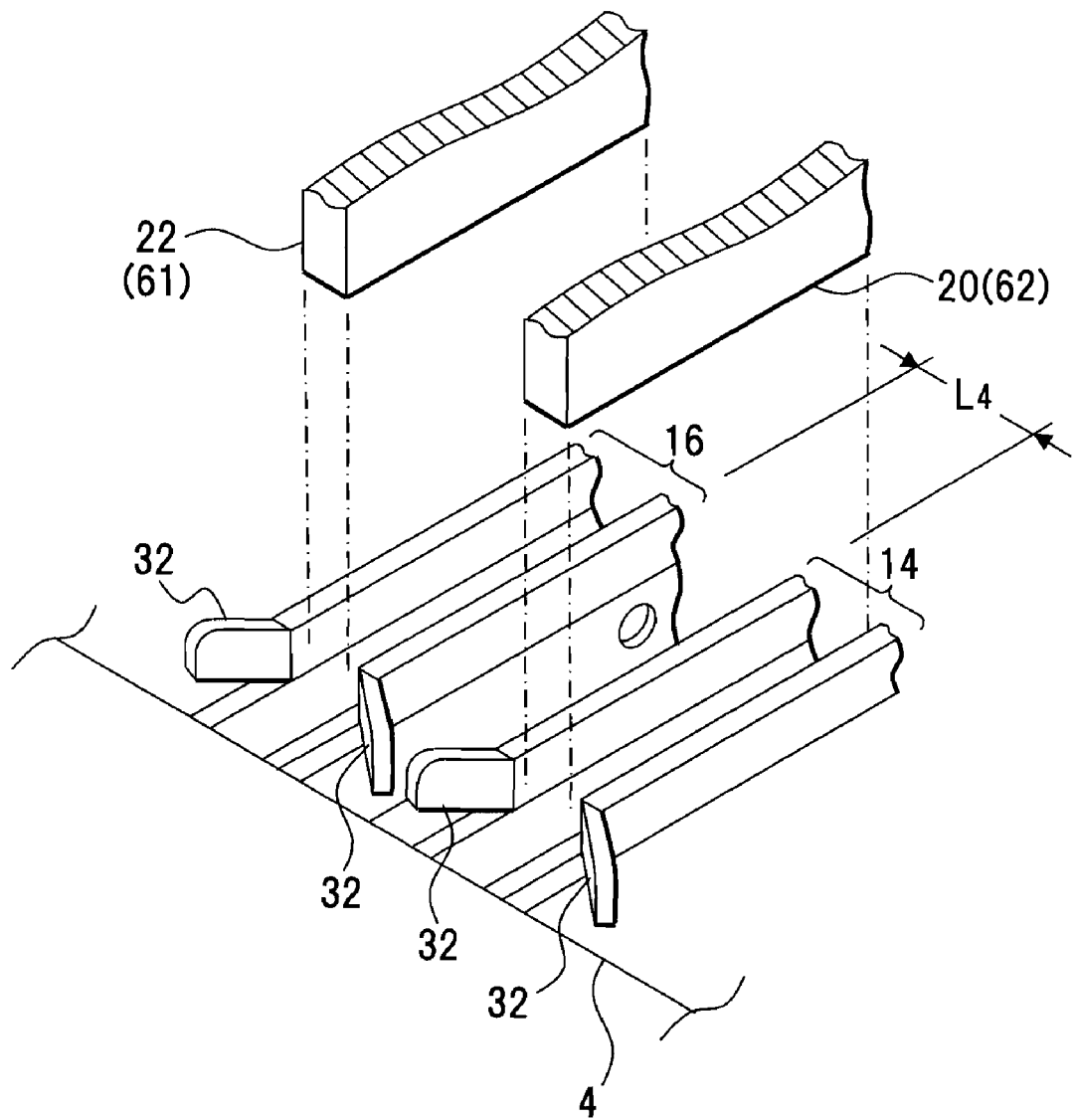
FIG. 8 is a perspective view of portions of the rails and the guide rails of the conventional server apparatus.

Since the distance $L_3$ (FIG. 5) exists between the units in the convention server apparatus 2, when the conventional housing 4 is the same as the housing 102 according to the embodiment and it is assumed that W denotes an effective disposition width of the unit and that n denotes the number of the disposed printed board units, a disposition width $Wm_1$ of the units of the conventional server apparatus 2 is obtained by reference to Equation (1) as follows:

$$Wm_1 = W - Lm = W - (n-1) \times L_3 \quad (9)$$

The effective disposition width Wm tends to decrease in proportion to the number of servers. On the other hand, since a disposition width $Wm_2$ is equal to $Wm_2 \approx W$ and the distance $L_3$ can be set as close to zero as possible ($L_3 \approx 0$) in the embodiment, the effective disposition width Wm given by the housing 102 can be applied to the occupation by the printed board units 1041 to 1044. As a result, when $\Delta Wm$ denotes a difference of the disposition width $Wm_2$ of the units of the server apparatus 100 from the disposition width $Wm_1$ of the units of the conventional server apparatus 2, $\Delta Wm$ is expressed as follows:

$$Wm_2 - Wm_1 = \Delta Wm \approx W - (W - Lm) = (n-1) \times L_3 \quad (10)$$

If n=4, $\Delta Wm = 3 * L_3$ is satisfied.

In this embodiment, since a distance corresponding to $\Delta Wm = 3 * L_3$ is distributed to the widths of the printed board units 1041, 1042, 1043 and 1044, Wn assumed to denote the increased width is expressed as follows:

$$Wn = \Delta Wm / 4 = 3 * L_3 \div 4 \quad (11)$$

The loss of the conventional distance expands the volume occupied by the printed board units 1041, 1042, 1043 and 1044, and contributes to the efficient utilization of the housing 102. If the printed board units having the same volume as the conventional units are used, the miniaturization of the housing can be achieved.

Figure 23A:
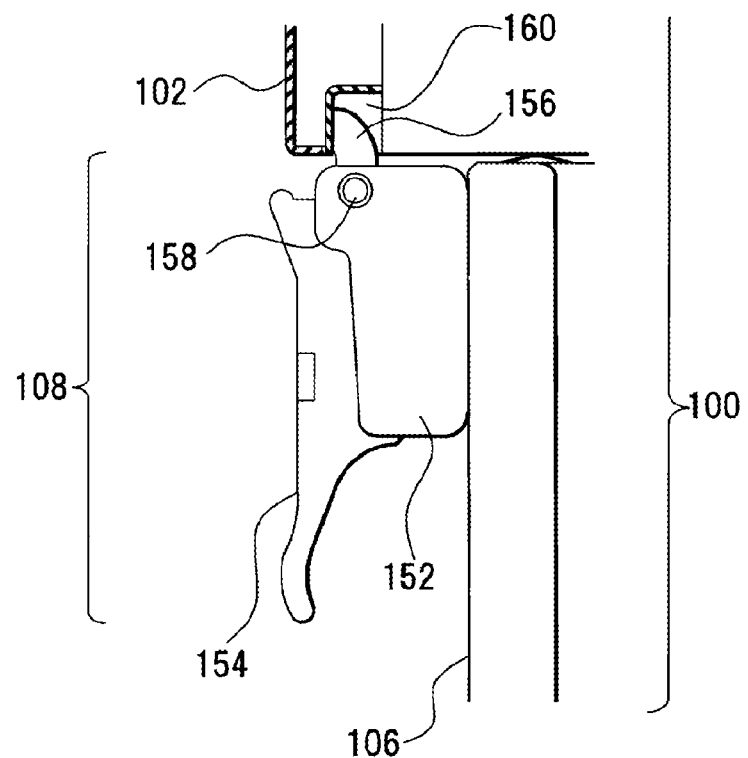
FIGS. 23A and 23B are diagrams of a latched state and an unlatched/pullout state of the printed board unit.
Figure 23B:
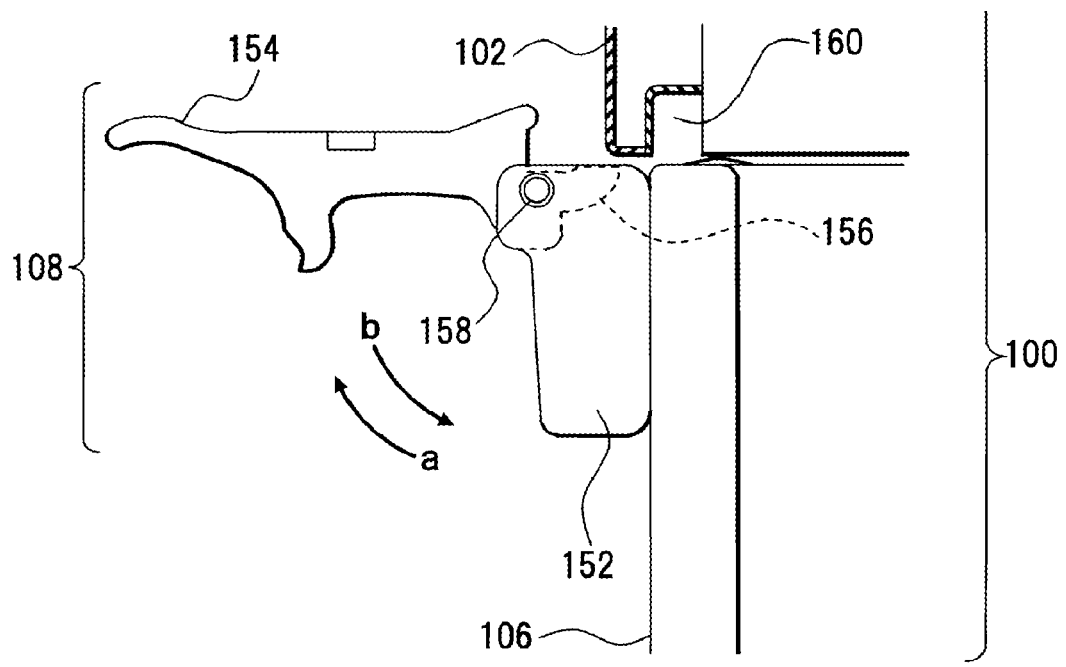

The latch device 108 will be described with reference to FIGS. 23A and 23B. FIG. 23A depicts a latched state of the printed board unit and FIG. 23B depicts an unlatched/pullout state of the printed board unit. Arrows a and b of FIG. 23B indicate the rotation directions of a latch.

As depicted in FIG. 23A, the latch device 108 includes a latch supporting unit 152, a latch handle unit 154 and a stopper 156. The latch supporting unit 152 is attached to the front panel portion 106 making up the outer wall of the housing 102. A shaft 158 is also included to rotatably support the latch handle unit 154 and the stopper 156 with this shaft 158. The latch handle unit 154 is an operating part for operation at the time of latching or unlatching. The stopper 156 is formed integrally with or separately from the latch handle unit 154 and is operated to the latched position or unlatched position in conjunction with the rotary operation of the latch handle unit 154. The housing 102 has a locking concave portion 160 formed to be engaged with the stopper 156. The state that the locking concave portion 160 is engaged with the stopper 156 is the latched state.

If the latch handle unit 154 is rotated in the direction of the arrow a from the latched state, the stopper 156 is released from the locking concave portion 160 as depicted in FIG. 23B and, for example, the printed board unit 1041 including the operated latch handle unit 154 is pulled out from the housing 102.

When the printed board unit 1041 is pushed into the housing 102 and the latch handle unit 154 is rotated in the direction of the arrow b while the printed board unit 1041 is held at a pushing end point, the stopper 156 is locked by the locking concave portion 160 and the printed board unit 1041 can be fixed into the housing 102 to achieve the latched state.

Although since the latch devices 108 are disposed on the upper and lower sides of the front panel portions 106 of the printed board units 1041 to 1044 in the above embodiment, the latch devices 108 can be operated, and latched or unlatched at the same time and the safety is assured, the single latch device 108 may be disposed on each of the front panel portions 106 of the printed board units 1041 to 1044.

Figure 24:
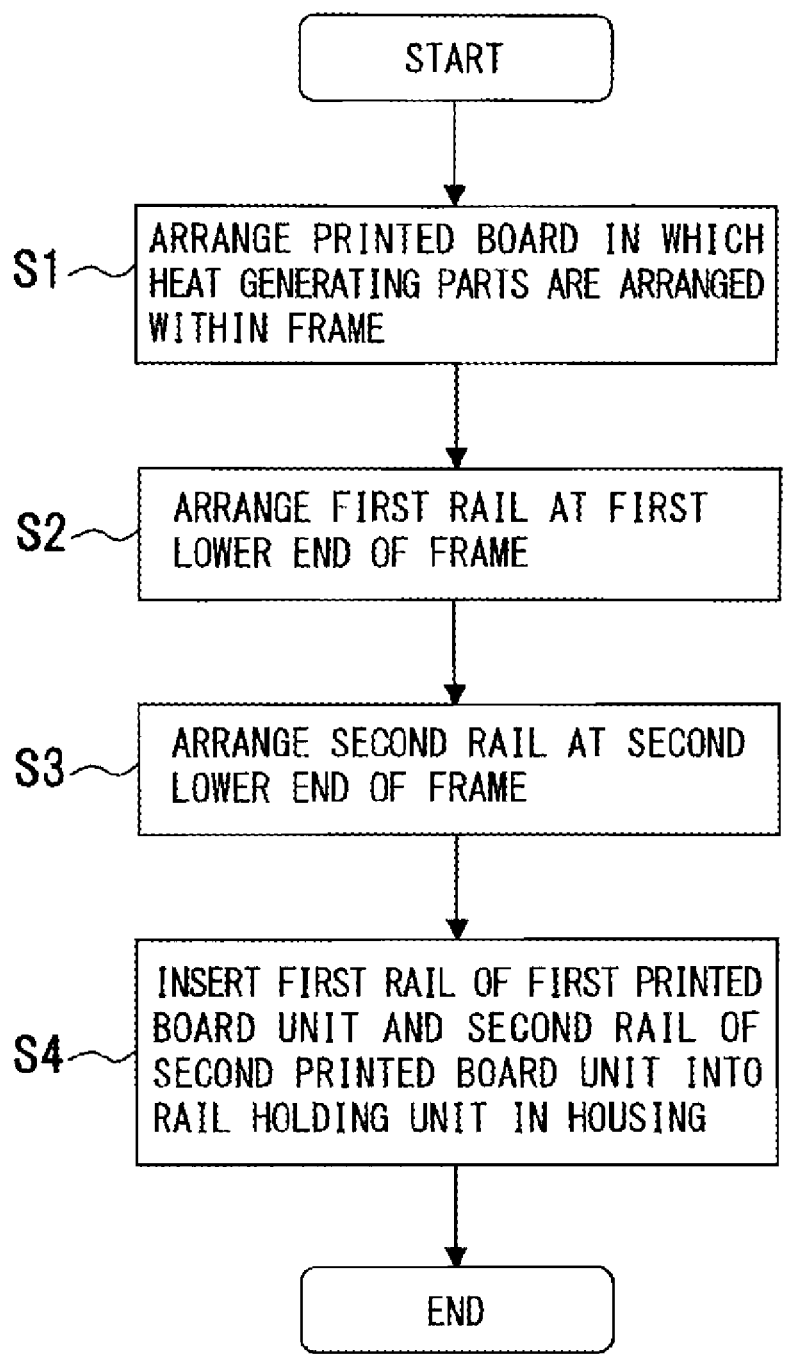
FIG. 24 is a flowchart of an example of a mounting method according to the first embodiment.

A mounting method according to the first embodiment will be described with reference to FIG. 24. FIG. 24 is a flowchart of an example of the mounting method according to the first embodiment.

The mounting method is an example of a mounting method for an implementing means of the above mounting structure, and the process procedures thereof include a) an arrangement process of the printed board 120 (step S1), b) an arrangement process of the first rail (step S2), c) an arrangement process of the second rail (step S3), and d) a rail insertion process (step S4).

a) Arrangement Process of Printed Board

In the arrangement process of the printed board 120, the printed boards 120 after completion of mounting and connecting operations of various components such as the heat generating parts 118 are arranged on the side wall portions 126 within the frames 122 of a plurality of the printed board units 1041 to 1044 (step S1).

b) Arrangement Process of First Rail

The first rail, i.e., the rail 134 is arranged at the first lower end of the side wall portion 126 disposed with the printed board 120 in the lower opening 130 (FIG. 12) included in each of the frames 122 of a plurality of the printed board units 1041 to 1044 (step S2). The rail 134 may be formed integrally with or configured separately from the side wall portion 126 and, if the rail 134 formed separately from the side wall portion 126, the rail 134 may be fixed to the side wall portion 126 with a fixing means such as welding or screwing.

c) Arrangement Process of Second Rail

The second rail 136 is arranged at the second lower end of the side wall portion 128 opposed to the first lower end of the side wall portion 126 in each of the openings 130 (step S3). The rail 136 may also be formed integrally with or configured separately from the side wall portion 126 and, if the rail 136 formed separately form the side wall portion 126, the rail 136 may be fixed to the side wall portion 128 with a fixing means such as welding or screwing.

d) Rail Insertion Process

The printed board units 1041 to 1044 are disposed in the housing 102 by inserting the first rails 134 and the adjacent second rails 136 of a plurality of the printed board units 1041 to 1044 into the guide rails 138 acting as the rail holding units having the shape conforming or approximate to a square U-shape in the housing 102 having the cooling fan device 114, which is a cooling fan sending air to the inside of the frame 122, arranged on the upper side (step S4). In this case, a rail having no adjacent rail, i.e., the rail 134 of the printed board unit 1041 is disposed in the guide rail 140 (FIG. 15) closer to the side wall portion 126 of the housing 102 and the rail 136 of the printed board unit 1044 is disposed in the guide rail 140 (FIG. 15) closer to the side wall portion 128 of the housing 102.

Through these process procedures, the server apparatus 100 depicted in FIG. 9 can easily and rapidly be configured.

The guide rail 138 acting as the rail holding unit that has the guide 148 guiding the two adjacent rails 134 and 136 and having a structure conforming or approximate to a truncated V-shape spreading toward the end (FIGS. 17 and 18). Therefore, this rail insertion process includes a process of inserting the first rail 134 and the adjacent second rail 136 along the guide 148 and, since the guide 148 exists in the single guide rail 138, the adjacent rails 134 and 136 can easily be arranged.

The features and advantages of the first embodiment described above will be listed as follows.

(1) The rails 134 and 136 are included for stable insertion at the time of mounting the printed board units 1041 to 1044 on the housing 102. That is, since the two rails 134 and 136 are provided on the both sides of the frame 122 and the guide rail 138 is shared by the adjacent units, the number of the guide rails 138 can be reduced. Since the gap $L_3$ between the conventional guide rails 14 and 16 can be eliminated, the leakage of the cooling air 116 is reduced and the cooling efficiency of the printed board units 1041 to 1044 can be enhanced.

(2) Since the one guide rail 138 is shared by the adjacent units, the rail positions of the printed board units 1041 to 1044 can be moved to the both ends of the units.

(3) Since the number of the guide rails 138 can be reduced by sharing the guide rail 138 with the adjacent printed board units, the rail supporting structure can be simplified and the cost can be reduced.

(4) The flow area of the cooling air 116 can be increased by sharing the guide rail 138 as compared to the structure with a guide rail disposed for each rail, the cooling effect can be improved. Since the guide rail 138 has no gap, the leakage of the cooling air 116 can be prevented to enhance the cooling efficiency.

Figure 25:
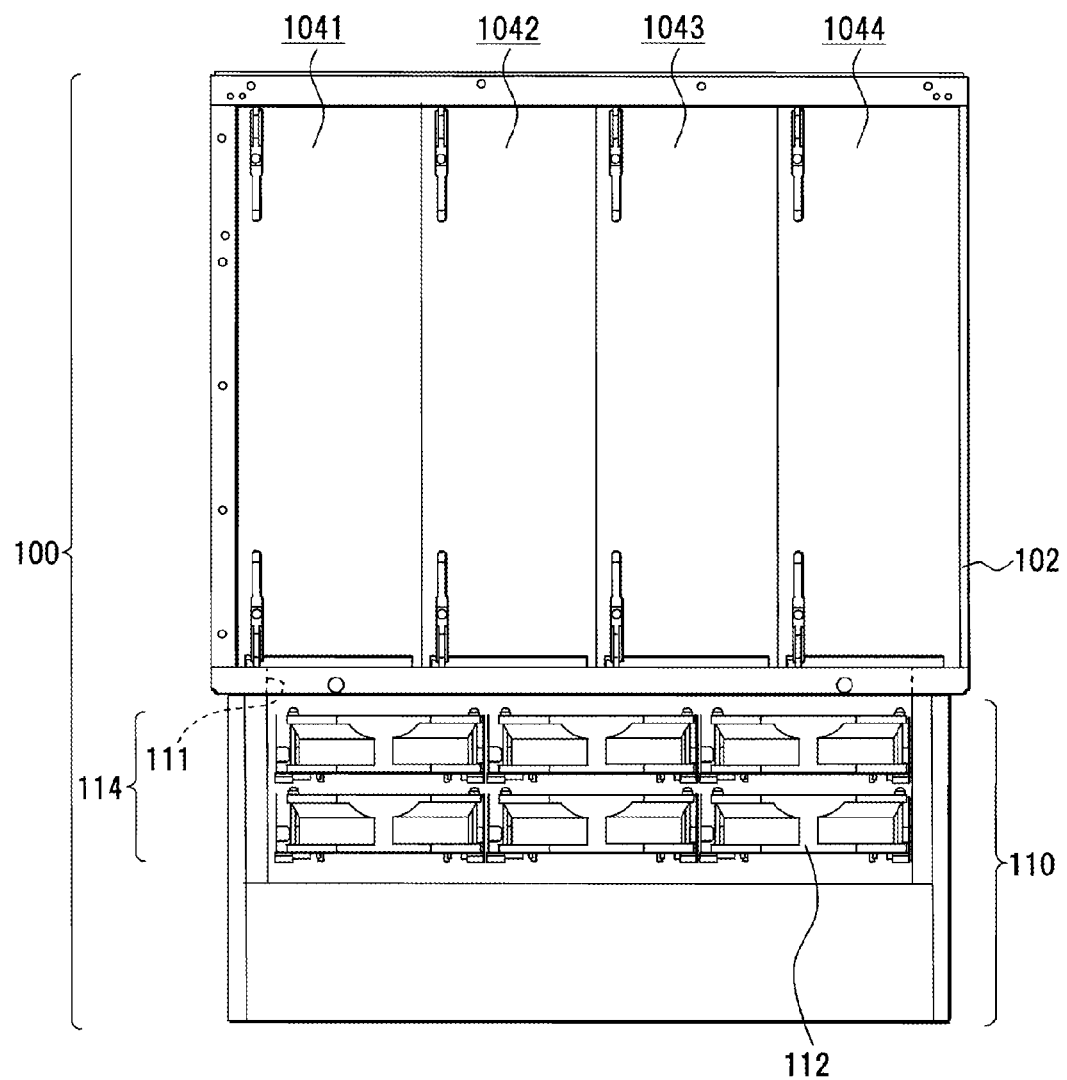
FIG. 25 is a diagram of a server apparatus according to a second embodiment.

Although the ventilation duct 110 is disposed on the upper side of the housing 102 and the cooling fan device 114 is disposed in the ventilation duct 110 in the first embodiment, the ventilation duct 110 may be disposed on the underside of the housing 102 to dispose the cooling fan device 114 as depicted in FIG. 25. FIG. 25 depicts a server apparatus according to a second embodiment. In FIG. 25, the same portions as FIGS. 9, 10 and 11 are denoted by the same reference numerals.

If the cooling fan device 114 is disposed on the underside of the housing 102, the cooling air 116 sucked into the ventilation duct 110 is allowed to flow from a ventilation hole 111 of the housing 102 through the frames 122 of the printed board units 1041 to 1044 in the housing 102 and is released into the outside air from the ventilation hole 109 (FIG. 10) on the upper side by the activation of the cooling fan device 114. This configuration can also achieve the heat radiation and the cooling of various components such as the heat generating parts 118 on the printed boards 120 of the printed board units 1041 to 1044.

Although the embodiments of the apparatus, the mounting structure, or the mounting method of the present invention have been described by exemplarily illustrating the server apparatus 100 in the above embodiments, the present invention is not limited to server apparatuses and is applicable to various electronic devices including the rail supporting structure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

Technical ideas extracted from the embodiments of the present invention described above will then be listed. The technical ideas according to the present invention can be comprehended at various levels and variations ranging from higher to lower conceptions and the present invention is not limited to the following description.

An apparatus has a plurality of printed board units each including a printed board to have heat generating parts arranged thereon, a frame to have the printed board arranged therein, a first rail to be arranged at a first lower end of an inner wall of the frame having the printed board located thereon in a lower opening of the frame, and a second rail to be arranged at a second lower end opposed to the first lower end in the opening; a housing including a rail holding unit to have a shape conforming or approximate to a square U-shape and to movably hold the first rail of a first printed board unit and the second rail of a second printed board unit adjacent to the first printed board unit among the plurality of printed board units; and a cooling fan to be arranged on an upper side or underside of the housing to send air into the frame. With this configuration, since the rails on the adjacent sides of the adjacent printed board units are held by the common rail holding unit, the distance between the adjacent printed board units can be narrowed in addition to the simplification of the supporting structure of the printed board units and the area occupied by the rail holding unit in the housing is reduced by sharing the rail holding unit to achieve the enhancement of the flowing performance of the cooling air and the improvement of the cooling efficiency of the heat generating parts, etc.

In the above apparatus, preferably, the housing may include a ventilation hole in a plane on either the upper side or underside of the housing with the cooling fan arranged. The rail holding unit may include a guide to guide two adjacent rails, and the guide may have a structure conforming or approximate to a truncated V-shape spreading toward the end. The printed board unit may include a latch on an outer wall of the frame of the printed board unit mounted on the housing for fixing the printed board unit to the housing.

In a mounting structure of mounting a plurality of printed board units to a housing, each of the plurality of printed board units includes a printed board to have heat generating parts arranged thereon, a frame to have the printed board arranged therein, a first rail to be arranged at a first lower end of an inner wall having the printed board located thereon in a lower opening of the frame, and a second rail to be arranged at a second lower end opposed to the first lower end in the opening, and the housing includes a cooling fan to be arranged on an upper side or underside of the housing to send air into the frame, and a rail holding unit to have a shape conforming or approximate to a square U-shape and to movably hold the first rail of a first printed board unit and the second rail of a second printed board unit adjacent to the first printed board unit among the plurality of printed board units. With this configuration, since the rails on the adjacent sides of the adjacent printed board units are held by the common rail holding unit in this mounting structure as described in relation to the apparatus, the distance between the adjacent printed board units can be narrowed in addition to the simplification of the supporting structure of the printed board units and the area occupied by the rail holding unit in the housing is reduced by sharing the rail holding unit to achieve the enhancement of the flowing performance of the cooling air and the improvement of the cooling efficiency of the heat generating parts, etc.

In the above mounting structure, preferably, the housing may include a ventilation hole in a plane on either the upper side or underside of the housing with the cooling fan arranged. The rail holding unit may include a guide to guide two adjacent rails, and the guide may have a structure conforming or approximate to a truncated V-shape spreading toward the end. The printed board unit may include a latch on an outer wall of the frame of the printed board unit mounted on the housing for fixing the printed board unit to the housing.

A mounting method of an apparatus to mount a plurality of printed board units to a housing includes arranging a printed board having heat generating parts arranged thereon within a frame of each of the plurality of printed board units; arranging first rails respectively at respective first lower ends of inner walls having the printed boards located thereon in lower openings included respectively in the frames of the plurality of printed board units; arranging second rails respectively at respective second lower ends opposed to the respective first lower ends in the openings; and inserting into a rail holding unit having a shape conforming or approximate to a square U-shape the first rail of a first printed board unit and the second rail of a second printed board unit adjacent to the first printed board unit among the plurality of printed board units in the housing arranged with a cooling fan sending air into the frame on an upper side or underside of the housing. With this configuration, since the rails on the adjacent sides of the adjacent printed board units are held by the common rail holding unit in this mounting method as described in relation to the apparatus, the distance between the adjacent printed board units can be narrowed in addition to the simplification of the supporting structure of the printed board units and the area occupied by the rail holding unit in the housing is reduced by sharing the rail holding unit to achieve the enhancement of the flowing performance of the cooling air and the improvement of the cooling efficiency of the heat generating parts, etc.

In the above mounting method, preferably, the rail holding unit may include a guide to have a structure conforming or approximate to a truncated V-shape spreading toward the end to guide two adjacent rails, and said inserting into the rail holding unit may be inserting the first rail of the first printed board unit and the second rail of the second printed board unit adjacent to the first printed board unit along the guide.

An apparatus has a plurality of printed board units each including a printed board to have electric components arranged thereon, a frame to have the printed board arranged therein, the frame having an opening formed on an underside thereof, a first rail to be arranged at a first side of a lower end of the frame, and a second rail to be arranged at a second side of a lower end of the frame opposed to the first side; and a housing to include a rail holding unit that holds the first rail provided on a first printed board unit and the second rail provided on a second printed board unit loaded adjacently to the first printed board unit among the plurality of printed board units such that the printed board units are freely moved.

According to the embodiments of the present invention, the following effects can be acquired.

(1) Since the rails on the adjacent sides of the adjacent printed board units are held by the rail holding unit, the simplification of the supporting structure and the cost reduction can be achieved as compared to the conventional apparatus with a guide rail disposed for each rail.

(2) Since the rails on the adjacent sides of the adjacent printed board units are held by the rail holding unit to share the rail holding unit, the distance between the adjacent printed board units is narrowed and the area occupied by the rail holding unit in the housing is reduced to enhance the flowing performance of the cooling air and to improve the cooling efficiency.

(3) Since the rails on the adjacent sides of the adjacent printed board units are held by the rail holding unit to achieve the sharing of the rail holding unit, the leakage of the cooling air can be prevented by the rail holding unit to increase the cooling efficiency of the printed board units and the heat generating parts.

(4) Since the rails on the adjacent sides of the adjacent printed board units are held by the rail holding unit, the utilization rate of the disposition space of the printed board units in the housing can be increased to achieve the expansion in volume of the printed board units disposed in the housing.

Although the most preferable embodiments, etc., of the present invention have been described as above, the present invention is not limited to the description and may variously be modified or altered by those skilled in the art based on the spirit of the present invention described in claims or disclosed herein of course and it is needless to say that such modifications and alterations fall within the present invention.

The present invention can be used for mounting printed board units of an apparatus including printed board units, etc., in a housing and is applicable to various electronic devices such as server apparatus using printed board units and including a rail supporting structure, which is useful.

What is claimed is:

1. An apparatus comprising:
   a plurality of printed board units each including
      a printed board that has heat generating parts arranged thereon,
      a frame that has the printed board arranged therein,
      a first rail arranged at a first lower end of the frame having the printed board located thereon, and
      a second rail arranged at a second lower end opposed to the first lower end in an opening;
   a housing including
      a rail holding unit that movably holds the first rail of a first printed board unit and the second rail of a second printed board unit adjacent to the first printed board unit, the first printed board unit and the second printed board unit being included in the plurality of printed board units, the rail holding unit being formed by including upright wall portions and a rail receiver, the upright wall portions, between which the rail receiver is located, being erected at sides of the rail receiver, the rail receiver receiving the first rail and the second rail, the rail receiver having a cross-sectional shape conforming to a square U-shape which opens downwardly, the cross-sectional shape being a shape of a cross-section for a movable direction of the first rail and the second rail; and
      a cooling fan arranged on an upper side or an underside of the housing to send air into the frame,
   wherein each of the first rail and the second rail is disposed on an extension of a side wall portion of the frame, and
   a width of the rail receiver in the rail holding unit is set larger than a total of a width of the first rail and a width of the second rail.

2. The apparatus of claim 1, wherein
   the housing further includes a ventilation hole in a plane on either the upper side or underside of the housing with the cooling fan arranged.

3. The apparatus of claim 1, wherein
   the rail holding unit includes a guide that guides the first rail of the first printed board unit and the second rail of the second printed board unit, and wherein
   the guide has a structure conforming to a truncated V-shape spreading toward the end.

4. The apparatus of claim 1, wherein
   the printed board unit further includes a latch on an outer wall of the frame of the printed board unit mounted on the housing that fixes the printed board unit to the housing.

5. A mounting structure of mounting a plurality of printed board units to a housing, wherein
   each of the plurality of printed board units includes
      a printed board that has heat generating parts arranged thereon,
      a frame that has the printed board arranged therein,
      a first rail arranged at a first lower end of the frame having the printed board located thereon, and
      a second rail arranged at a second lower end opposed to the first lower end in an opening, and wherein
   the housing includes
      a rail holding unit that movably holds the first rail of a first printed board unit and the second rail of a second printed board unit adjacent to the first printed board unit, the first printed board unit and the second printed board unit being included in the plurality of printed board units, the rail holding unit being formed by including upright wall portions and a rail receiver, the upright wall portions, between which the rail receiver is located, being erected at sides of the rail receiver, the rail receiver receiving the first rail and the second rail, the rail receiver having a cross-sectional shape conforming to a square U-shape which opens downwardly, the cross-sectional shape being a shape of a cross-section for a movable direction of the first rail and the second rail, and
      a cooling fan arranged on an upper side or an underside of the housing to send air into the frame,
   wherein each of the first rail and the second rail is disposed on an extension of a side wall portion of the frame, and
   a width of the rail receiver in the rail holding unit is set larger than a total of a width of the first rail and a width of the second rail.

6. The mounting structure of claim 5, wherein
   the housing further includes a ventilation hole in a plane on either the upper side or underside of the housing with the cooling fan arranged.

7. The mounting structure of claim 5, wherein
   the rail holding unit includes a guide that guides the first rail of the first printed board unit and the second rail of the second printed board unit, and wherein
   the guide has a structure conforming to a truncated V-shape spreading toward the end.

8. The mounting structure of claim 5, wherein
   the printed board unit further includes a latch on an outer wall of the frame of the printed board unit mounted on the housing that fixes the printed board unit to the housing.

* * * * *